(12) United States Patent
Yang et al.

(10) Patent No.: US 11,796,917 B2
(45) Date of Patent: Oct. 24, 2023

(54) WIDTH ADJUSTMENT OF EUV RADIATION BEAM

(71) Applicant: TAIWAN SEMICONDUCTOR MANUFACTURING COMPANY, LTD., Hsinchu (TW)

(72) Inventors: Chi Yang, Tainan (TW); Tsung-Hsun Lee, Kaohsiung (TW); Jian-Yuan Su, Taichung (TW); Ching-Juinn Huang, Changhua (TW); Po-Chung Cheng, Longxing Village (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/549,682

(22) Filed: Dec. 13, 2021

(65) Prior Publication Data

US 2022/0357662 A1 Nov. 10, 2022

Related U.S. Application Data

(60) Provisional application No. 63/185,933, filed on May 7, 2021.

(51) Int. Cl.
*G03F 7/20* (2006.01)
*H01L 21/027* (2006.01)
*G03F 7/00* (2006.01)

(52) U.S. Cl.
CPC ........ *G03F 7/2008* (2013.01); *G03F 7/70033* (2013.01); *G03F 7/2004* (2013.01); *H01L 21/0274* (2013.01)

(58) Field of Classification Search
CPC .. G03F 7/2008; G03F 7/70033; G03F 7/2004; G03F 7/70075; G03F 7/70116; G03F 7/70125; H01L 21/0274
See application file for complete search history.

(56) References Cited

U.S. PATENT DOCUMENTS 6,316,163 B1 * 11/2001 Magoshi ................ B82Y 10/00
                                                    430/30
6,421,180 B1 * 7/2002 Montgomery ..... G02B 27/1086
                                                    250/237 R (Continued)

FOREIGN PATENT DOCUMENTS

WO   2010/037453 A1   4/2010
WO   2016/177599 A1   11/2016

OTHER PUBLICATIONS

Dr. Sascha Migura, "Optics for EUV Lithography," Carl Zeis SMT GmbH, Oberkochen, Germany, 2018 EUVL Workshop, Jun. 13, 2018, Berkeley, CA.

*Primary Examiner* — Deoram Persaud
(74) *Attorney, Agent, or Firm* — McDermott Will & Emery LLP

(57) ABSTRACT

In a method of pattern formation information including a pattern size on a reticle is received. A width of an EUV radiation beam is adjusted in accordance with the information. The EUV radiation beam is scanned on the reticle. A photo resist layer is exposed with a reflected EUV radiation beam from the reticle. An increase of intensity per unit area of the EUV radiation beam on the reticle after the adjusting the width is greater when the width before adjustment is W1 compared to an increase of intensity per unit area of the EUV radiation beam on the reticle after the adjusting the width when the width before adjustment is W2 when W1>W2.

20 Claims, 15 Drawing Sheets

(56) References Cited

U.S. PATENT DOCUMENTS

| | | | |
|---|---|---|---|
| 2005/0270513 A1* | 12/2005 | Dierichs | G03F 7/702 |
| | | | 355/67 |
| 2007/0273852 A1* | 11/2007 | Arai | G03F 7/70458 |
| | | | 355/44 |
| 2008/0068441 A1* | 3/2008 | Abe | G03F 7/2053 |
| | | | 347/254 |
| 2016/0187785 A1* | 6/2016 | Deguenther | G03F 7/70075 |
| | | | 355/67 |
| 2016/0225477 A1* | 8/2016 | Banine | G21K 1/067 |
| 2017/0097576 A1* | 4/2017 | Bangar | G03F 7/70633 |
| 2019/0105511 A1* | 4/2019 | Papeer | G21K 5/10 |
| 2022/0163899 A1* | 5/2022 | Conley | G03F 7/70575 |

* cited by examiner

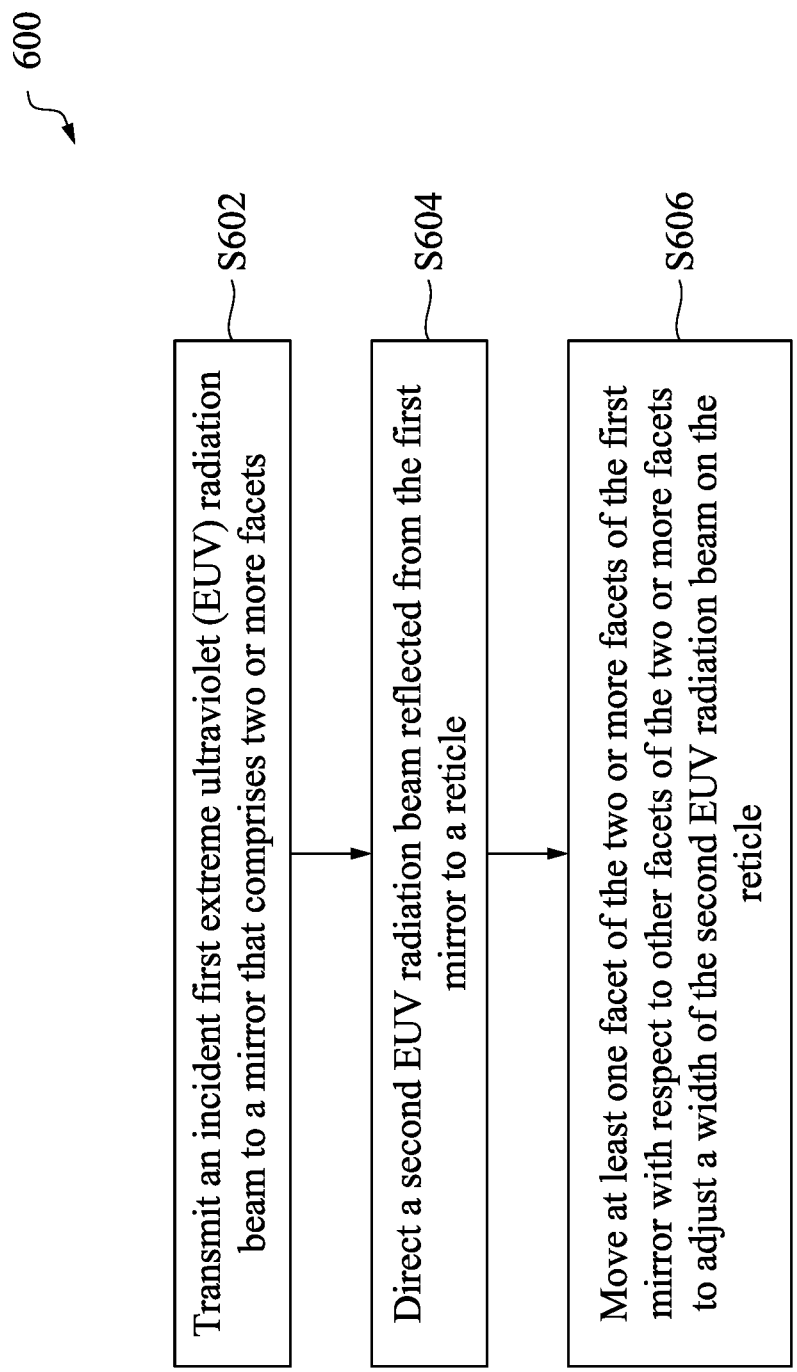

WIDTH ADJUSTMENT OF EUV RADIATION BEAM

PRIORITY CLAIM AND CROSS-REFERENCE TO RELATED APPLICATIONS

This application claims priority to U.S. Provisional Application No. 63/185,933 filed on May 7, 2021, entitled "Width Modulation of EUV Beam," the entire disclosure of which is incorporated herein by reference.

BACKGROUND

During an integrated circuit (IC) design, a number of patterns of the IC, for different steps of IC processing, are generated on a substrate, e.g., a wafer. The patterns may be produced by projecting, e.g., imaging, layout patterns of a photo mask onto a photo resist layer of the substrate. A lithographic process transfers the layout patterns of the photo mask onto the photo resist layer of the substrate such that etching, implantation, or other steps are applied only to predefined regions of the substrate. The projection of the photo mask is performed by a radiation beam, e.g., an extreme ultraviolet (EUV) radiation beam, of an EUV radiation source, such as a laser produced plasma (LPP) EUV source, in an exposure device. The EUV radiation beam is projected through an illumination optics onto the photo mask, e.g., a reflective reticle. The reflected EUV light from the photo mask in projected through a projection optics onto the substrate to produce a resist pattern on the substrate.

In some embodiments, the EUV radiation beam produced by the illumination optics covers an area that is larger than the area of the layout patterns of the photo mask and, thus, may cover outside the layout patterns of the photo mask. In some embodiments, the extra coverage of the EUV radiation beam is blocked by a reticle-mask (REMA). The REMA blocks the EUV radiation beam and, thus, reduces a utilization efficiency of the EUV radiation beam and may also reduce the throughput of the exposure device. It is desirable to use a method and system to more efficiently utilize the EUV radiation beam.

BRIEF DESCRIPTION OF THE DRAWING

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 6A, 6B, and 6C show a flow diagrams of processes for adjusting the extent of the EUV radiation beam of the lithographic system and producing a resist layer in accordance with some embodiments of the present disclosure.

DETAILED DESCRIPTION

Figure 1:
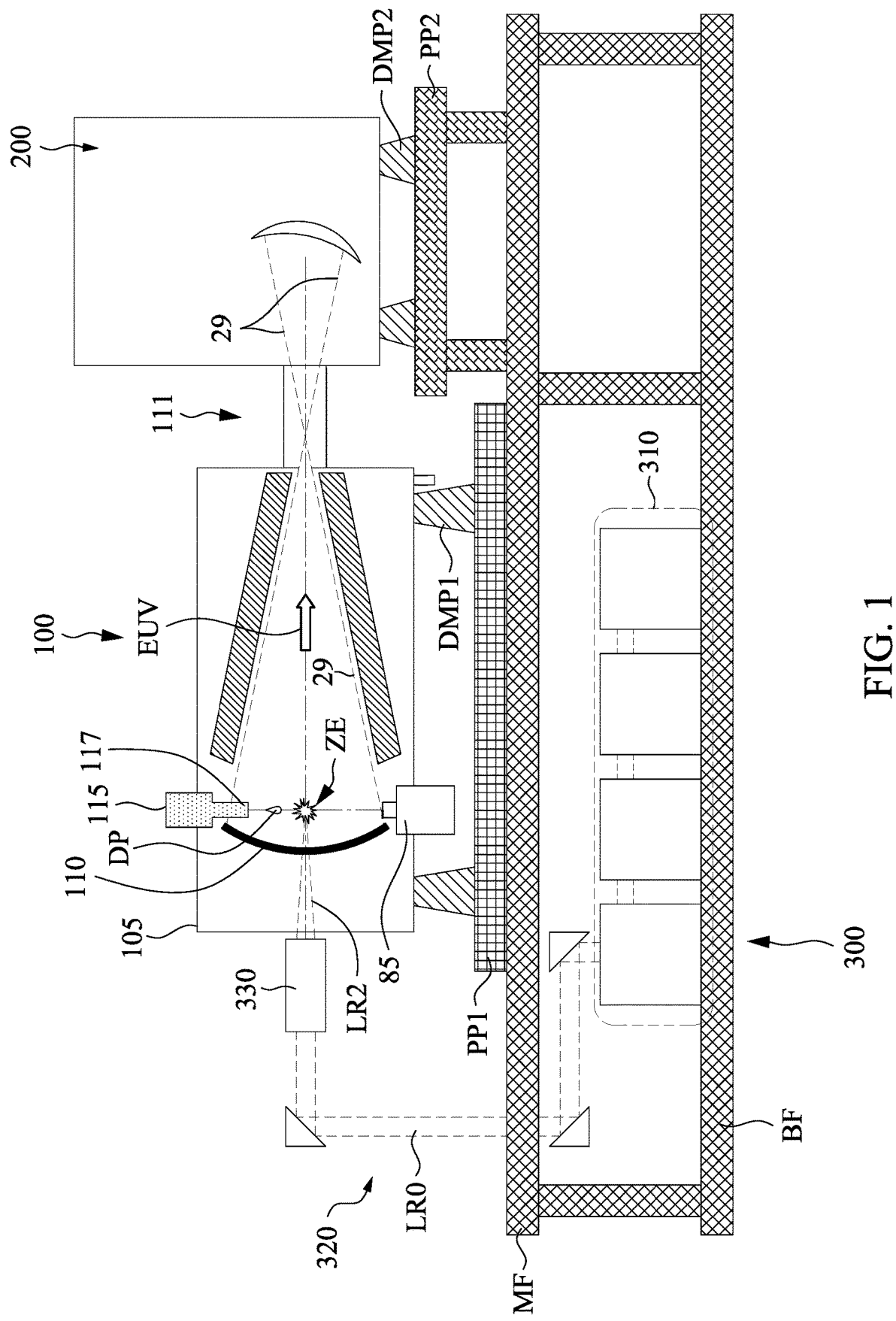
FIG. 1 shows a schematic view of an EUV lithography system with a laser produced plasma (LPP) EUV radiation source and an exposure device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In some embodiments, the extreme ultraviolet (EUV) radiation produced by an EUV radiation source covers a larger area of the photo mask than the layout patterns and covers outside of the layout patterns. Extra coverage may be projected onto the photo resist layer of the wafer and may cause neighboring dies of the wafer to affect each other and may affect the critical dimension around the edges of the dies. The extra coverage may be reduced by REMAs that block the extra coverage, however, the blockage throws away valuable EUV radiation and reduces the throughput and efficiency of the exposure device, e.g., reduces the efficiency of the EUV radiation source of the exposure device of the lithographic system.

In some embodiments, the exposure device that projects the EUV radiation beam onto a wafer includes a plurality of mirrors such as convex, concave, and flat mirrors that are used in the exposure device for directing the EUV radiation to the photo mask and also for projecting the reflected EUV radiation from the photo mask to a wafer. In some embodiments, the mirrors of the illumination system of the exposure device that project the EUV radiation beam onto the photo mask are facet mirrors, e.g., mirrors that include one or more facets. In some embodiments, the facet mirrors are coupled and controlled by an beam width adjuster (e.g., a beam width controller) or a width controller) and by changing the position and/or direction of the mirrors (defined as perpendicular to the surface of the facet mirror), the coverage area of the EUV radiation beam on the photo mask is adjusted such that reduced or substantially no extra coverage occurs. Thus, no blocking of the EUV radiation beam is needed and the throughput and/or efficiency increases compared to when REMAs are used. In some embodiments, an actuator attached to the beam width controller moves and/or rotates the facet mirrors relative to each other to adjust the coverage area on the photo mask. In some embodiments, a beam width controller, e.g., an image width controller, moves the facets of the mirrors in lateral directions, e.g., the X-direction and/or the Z-direction and/or rotates the facet mirrors in perpendicular orientations to adjust the coverage area on the photo mask in both lateral directions, X-direction and Z-direction. In some embodiments, each facet mirror of the plurality of facet mirrors includes multiple segments with each segment having a plurality of facets and the beam width controller changes the position and direction of facets of each segment of each facet mirror to adjust the coverage area. In some embodiments, changing the position includes moving the facet mirrors in all six directions: up and down (e.g., in Z-direction), right and left (e.g., in X-direction), and back and forth (e.g., in Y-direction). Thus, in some embodiments, the beam width controller moves the facets of the mirrors back and forth, which is parallel to the direction of transmission of the EUV radiation beam to adjust the coverage area on the photo mask. In some embodiments, the beam width controller laterally moves the facets of the mirrors right and left or up and down to change the angle of incidence of the EUV radiation beam onto the photo mask.

Merely cutting-off a part of the EUV beam by REMAs wastes the part of the EUV beam. In the present embodiments, the intensity per unit area of the EUV beams after the width-control (concentrating the EUV beam) is increased. Accordingly, it is possible to reduce an exposure time per wafer, which in turn increases a throughput of the EUV exposure tool.

FIG. 1 shows a schematic view of an EUV lithography system with a laser produced plasma (LPP) EUV radiation source and an exposure device. The EUV lithography system includes an EUV radiation source 100 (an EUV light source) to generate EUV radiation, an exposure device 200, such as a scanner, and an excitation laser source 300. As shown in FIG. 1, in some embodiments, the EUV radiation source 100 and the exposure device 200 are installed on a main floor MF of a clean room, while the excitation laser source 300 is installed in a base floor BF located under the main floor. Each of the EUV radiation source 100 and the exposure device 200 are placed over pedestal plates PP1 and PP2 via dampers DMP1 and DMP2, respectively. The EUV radiation source 100 and the exposure device 200 are coupled to each other by a coupling mechanism, which may include a focusing unit 111. In some embodiments, a lithography system includes the EUV radiation source 100 and the exposure device 200.

The lithography system is an EUV lithography system designed to expose a resist layer by EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 50 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure device 200 includes various reflective optical components, such as convex/concave/flat mirrors, a mask holding mechanism including a mask stage, and wafer holding mechanism, e.g., a substrate holding mechanism or a wafer stage. The EUV radiation generated by the EUV radiation source 100 is guided by the reflective optical components onto a mask secured on the mask stage. In some embodiments, the mask stage includes an electrostatic chuck (e-chuck) to secure the mask. Because gas molecules absorb EUV light, the lithography system for the EUV lithography patterning is maintained in a vacuum or a-low pressure environment to avoid EUV intensity loss. As noted, the exposure device 200 is maintained under a vacuum environment and the reticle is mounted over a substrate, with a photo resist layer disposed on the substrate. The EUV radiation generated by the EUV radiation source 100 is directed by the optical components to project the mask on the photo resist layer of the substrate.

In the present disclosure, the terms mask, photomask, and reticle are used interchangeably. In addition, the term resist and photoresist are used interchangeably. In some embodiments, the mask is a reflective mask. In some embodiments, the mask includes a substrate with a suitable material, such as a low thermal expansion material or fused quartz. In various examples, the material includes $TiO_2$ doped $SiO_2$, or other suitable material with low thermal expansion. The mask includes multiple reflective layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the ML. The absorption layer is patterned to define a layer of an integrated circuit (IC).

The exposure device 200 includes a projection optics modules for imaging the pattern of the mask on to a semiconductor substrate with a resist coated thereon secured on a substrate stage of the exposure device 200. The projection optics modules generally includes reflective optics. The EUV radiation (EUV light) directed from the mask, carrying the image of the pattern defined on the mask, is collected and directed by the projection optics modules, e.g., mirrors, thereby forming an image on the resist.

In various embodiments of the present disclosure, the semiconductor substrate is a semiconductor wafer, such as a silicon wafer or other type of wafer to be patterned. The semiconductor substrate is coated with a resist layer sensitive to the EUV light in presently disclosed embodiments. Various components including those described above are integrated together and are operable to perform lithography exposing processes. The lithography system may further include other modules or be integrated with (or be coupled with) other modules.

As shown in FIG. 1, the EUV radiation source 100 includes a droplet generator 115 and a LPP collector mirror 110, enclosed by a chamber 105. The droplet generator 115 generates a plurality of target droplets DP, which are supplied into the chamber 105 through a nozzle 117. In some embodiments, the target droplets DP are tin (Sn), lithium (Li), or an alloy of Sn and Li. In some embodiments, the target droplets DP each have a diameter in a range from about 10 microns (µm) to about 100 µm. For example, in an embodiment, the target droplets DP are tin droplets, each having a diameter of about 10 µm, about 25 µm, about 50 µm, or any diameter between these values. In some embodiments, the target droplets DP are supplied through the nozzle 117 at a rate in a range from about 50 droplets per second (i.e., an ejection-frequency of about 50 Hz) to about 50,000 droplets per second (i.e., an ejection-frequency of about 50 kHz). For example, in an embodiment, target droplets DP are supplied at an ejection-frequency of about 50 Hz, about 100 Hz, about 500 Hz, about 1 kHz, about 10 kHz, about 25 kHz, about 50 kHz, or any ejection-frequency between these frequencies. The target droplets DP are ejected through the nozzle 117 and into a zone of excitation ZE (e.g., a target droplet location) at a speed in a range from about 10 meters per second (m/s) to about 100 m/s in various embodiments. For example, in an embodiment, the target droplets DP have a speed of about 10 m/s, about 25 m/s, about 50 m/s, about 75 m/s, about 100 m/s, or at any speed between these speeds.

The excitation laser beam LR2 generated by the excitation laser source 300 is a pulsed beam. The laser pulses of laser beam LR2 are generated by the excitation laser source 300. The excitation laser source 300 may include a laser generator 310, laser guide optics 320 and a focusing apparatus 330. In some embodiments, the laser generator 310 includes a carbon dioxide ($CO_2$) or a neodymium-doped yttrium aluminum garnet (Nd:YAG) laser source with a wavelength in the infrared region of the electromagnetic spectrum. For example, the laser source 300 has a wavelength of 9.4 µm or 10.6 µm in an embodiment. The laser light beam LR0 generated by the excitation laser source 300 is guided by the laser guide optics 320 and focused, by the focusing apparatus 330, into the excitation laser beam LR2 that is introduced into the EUV radiation source 100. In some embodiments, in addition to $CO_2$ and Nd:YAG lasers, the laser beam LR2 is generated by a gas laser including an excimer gas discharge laser, helium-neon laser, nitrogen laser, transversely excited atmospheric (TEA) laser, argon ion laser, copper vapor laser, KrF laser or ArF laser; or a solid state laser including Nd:glass laser, ytterbium-doped glasses or ceramics laser, or ruby laser. In some embodiments, a non-ionizing laser beam LR1 (not shown) is also generated by the excitation laser source 300 and the laser beam LR1 is also focused by the focusing apparatus 330 to pre-heat a given target droplet by generating a pre-heat laser pulse.

In some embodiments, the excitation laser beam LR2 includes the pre-heat laser pulse and a main laser pulse. In such embodiments, the pre-heat laser pulse (interchangeably referred to herein as the "pre-pulse) is used to heat (or pre-heat) the given target droplet to create a low-density target plume with multiple smaller droplets, which is subsequently heated (or reheated) by the main laser pulse from the main laser, to generate increased emission of EUV light compared to when the pre-heat laser pulse is not used.

In various embodiments, the pre-heat laser pulses have a spot size about 100 µm or less, and the main laser pulses have a spot size in a range of about 150 µm to about 300 µm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser beam LR2 is matched with the ejection-frequency of the target droplets DP in an embodiment.

The laser beam LR2 is directed through windows (or lenses) into the zone of excitation ZE. The windows adopt a suitable material substantially transparent to the laser beams. The generation of the laser pulses is synchronized with the ejection of the target droplets DP through the nozzle 117. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation beam 29, which is collected by the collector mirror 110. The collector mirror 110, an EUV collector mirror, further reflects and focuses the EUV radiation beam 29 for the lithography exposing processes performed through the exposure device 200. A droplet DP that does not interact with the laser pulses is captured by the droplet catcher 85. As shown in FIG. 1, the EUV radiation beam 29 from the collector mirror 110 focuses at the focusing unit 111 between EUV radiation source 100 and the exposure device 200. The EUV radiation beam 29 that enters from the focusing unit 111 into the exposure device 200 is consistent with EUV radiation that is originated from the focused point, e.g., a point source, in the focusing unit 111.

One method of synchronizing the generation of a pulse (either or both of the pre-pulse and the main pulse) from the excitation laser with the arrival of the target droplet in the zone of excitation is to detect the passage of a target droplet at given position and use it as a signal for triggering an excitation pulse (or pre-pulse). In this method, if, for example, the time of passage of the target droplet is denoted by $t_o$, the time at which EUV radiation is generated (and detected) is denoted by $t_{rad}$, and the distance between the position at which the passage of the target droplet is detected and a center of the zone of excitation is d, the speed of the target droplet, $v_{dp}$, is calculated as $$v_{dp}=d/(t_{rad}-t_o) \qquad \text{equation (1)}.$$

Because the droplet generator 115 is expected to reproducibly supply droplets at a fixed speed, once $v_{dp}$ is calculated, the excitation pulse is triggered with a time delay of $d/v_{dp}$ after a target droplet is detected to have passed the given position to ensure that the excitation pulse arrives at the same time as the target droplet reaches the center of the zone of excitation. In some embodiments, because the passage of the target droplet is used to trigger the pre-pulse, the main pulse is triggered following a fixed delay after the pre-pulse. In some embodiments, the value of target droplet speed $v_{dp}$ is periodically recalculated by periodically measuring $t_{rad}$, if needed, and the generation of pulses with the arrival of the target droplets is resynchronized.

Figure 2A:
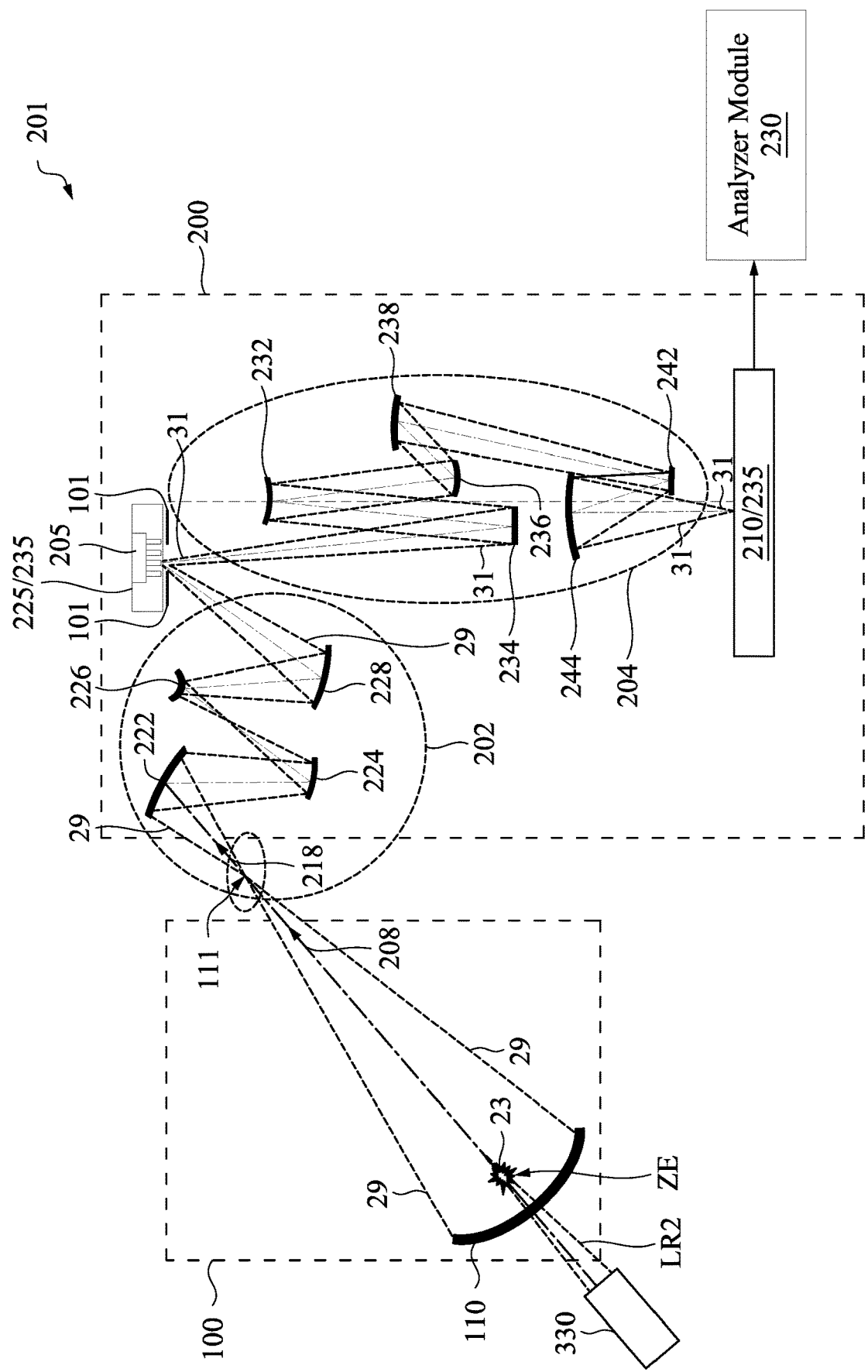
FIGS. 2A, 2B, and 2C show a schematic view of an EUV lithography system with an LPP EUV radiation source, an exposure device, and a reticle mount structure showing a reticle and show schematic views of illumination optics that includes a field facet module and a pupil facet module for illuminating a reticle.
Figure 2C:
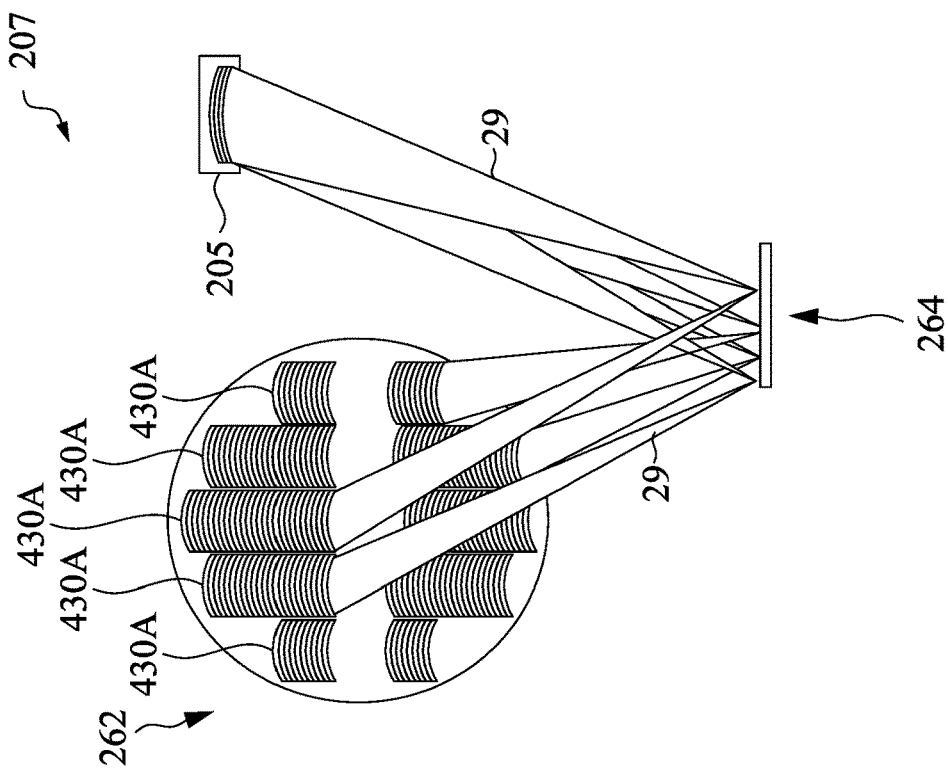
Figure 2B:
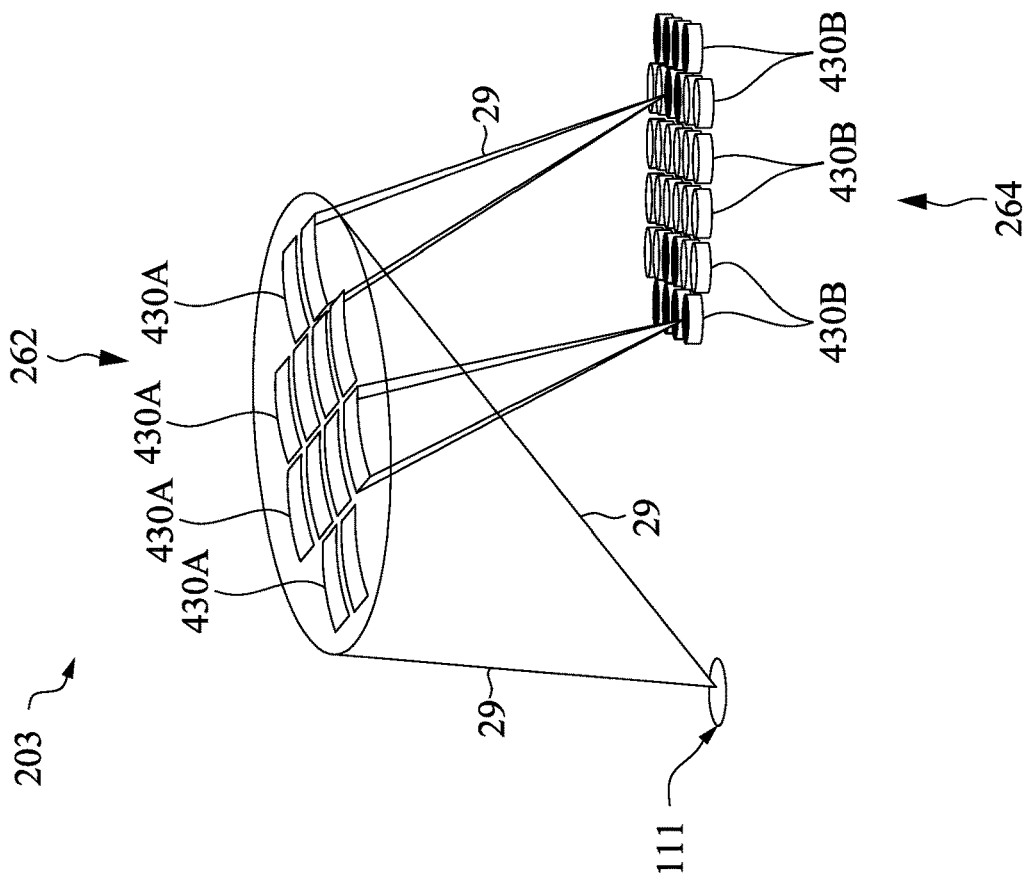

FIGS. 2A, 2B, and 2C show a schematic view of an EUV lithography system with an LPP EUV radiation source, an exposure device, and a reticle mount structure showing a reticle and show schematic views of illumination optics that includes a field facet module and a pupil facet module for illuminating a reticle. FIG. 2A shows a schematic view 201 of an EUV lithography system with a LPP EUV radiation source 100, an exposure device 200, and a reticle mount structure 225 showing a reticle 205, e.g., a photo mask. FIG. 2A also shows REMAs 101 for limiting, e.g., blocking, the EUV radiation beam. The EUV radiation source 100 produces the EUV radiation beam 29 by using the focusing apparatus 330 to focus the laser beam LR2 at the zone of excitation ZE to generate the plasma plume 23. Part of the EUV radiation generated by the plasma plume is the EUV radiation beam 29 that impinges on the collector mirror 110 and reflected from the collector mirror 110 and passes through the focusing unit 111 outside EUV radiation source 100 after exiting the EUV radiation source 100 through an aperture 208 of the EUV radiation source 100. In some embodiments, the aperture 208 is made of a material transparent to EUV radiation.

The EUV lithography system of FIG. 2A also includes the exposure device 200. The exposure device includes a plurality of convex, concave, or flat mirrors. As shown, the EUV radiation beam 29 is focused by the focusing unit 111 between the EUV radiation source 100 and the exposure device 200 and then enters the exposure device 200 through an aperture 218 of the exposure device 200 and the aperture 218 is made of a material transparent to EUV radiation in some embodiments. After entering the exposure device 200, the EUV radiation beam 29 is directed by illumination optics 202 to the reticle 205. As shown, the EUV radiation beam 29 is directed to a converging mirror 222 of the illumination optics 202 and reflects from the converging mirror 222, is directed to another converging mirror 224 of the illumination optics 202 and reflects from the converging mirror 224, is directed to a diverging mirror 226 of the illumination optics 202 and reflects from the diverging mirror 226, and is directed a flat mirror 228 of the illumination optics 202 and reflects from the flat mirror 228 to impinge on the reticle 205, e.g., a reflective photo mask. The EUV radiation beam 31 is reflected from the layout patterns of the reticle 205. In some embodiments, one or more the mirrors 222, 224, 226, or 228 of the illumination optics 202 are facet mirrors, e.g., mirrors that include a plurality of facets.

FIGS. 2B and 2C show schematic views 203 and 207 of the illumination optics 202. The illumination optics 202 includes a field facet module 262 having a plurality of facets 430A (mirrors) and a pupil facet module 264 having a plurality of facets 430B (mirrors). As shown in FIG. 2B, each of the facets 430A of the field facet module 262 reflects the EUV radiation beam 29 coming from the focusing unit 111 toward a corresponding one of the facets 430B of the pupil facet module 264. As shown in FIG. 2C, the facets 430B of the pupil facet module 264 further reflects the EUV light toward the reticle 205. In some embodiments of the present disclosure, one or more of the facets 430A or the facets 430B are controllable to change an EUV spot size on the pupil facet module 264 or to change the EUV spot on the reticle 205. In some embodiments, as shown in FIG. 2C, the facet mirrors 430A are stacked together. Thus, the facet mirrors 430A or 430B of FIG. 2B, are two or more of the same facet mirrors 430A or 430B that are stacked together. Controlling the location of the stacked facet mirrors 430A or 430B with respect to each other and controlling the curvature of the facet mirrors 430A or 430B are described with respect to FIGS. 3A, 3B, 3C, 3D, 3E, and 3F.

Referring back to FIG. 2A, after reflecting from the layout patterns of the reticle 205, the EUV radiation beam 31 is directed by projection optics 204 to the wafer system 210 (a substrate with a photo resist layer on the substrate) or the image detector 235. As shown, the EUV radiation beam 31 is directed to a flat mirror 234 of the projection optics 204 and reflects from the flat mirror 234, is directed to a diverging mirror 232 of the projection optics 204 and reflects from the diverging mirror 232, is directed to another diverging mirror 236 of the projection optics 204 and reflects from the diverging mirror 236, is directed to a converging mirror 238 of the projection optics 204 and reflects from the converging mirror 238, is directed to another diverging mirror 242 of the projection optics 204 and reflects from the diverging mirror 242, is directed to another converging mirror 244 of the projection optics 204 and reflects from the converging mirror 244 to impinge on the wafer system 210 or an image detector 235. In some embodiments, one or more the mirrors 232, 234, 236, 238, 242, or 244 of the projection optics 204 are a field facet module or a pupil facet module.

Figure 3A:
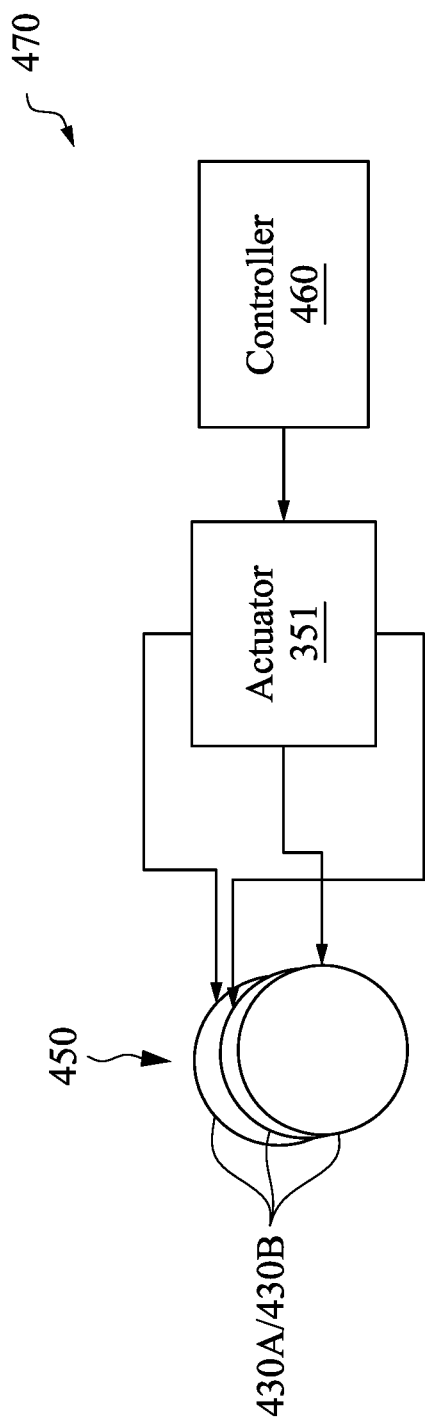
FIGS. 3A, 3B, 3C, 3D, 3E, and 3F show facet mirrors and facet mirror control systems in accordance with some embodiments of the present disclosure.
Figure 3B:
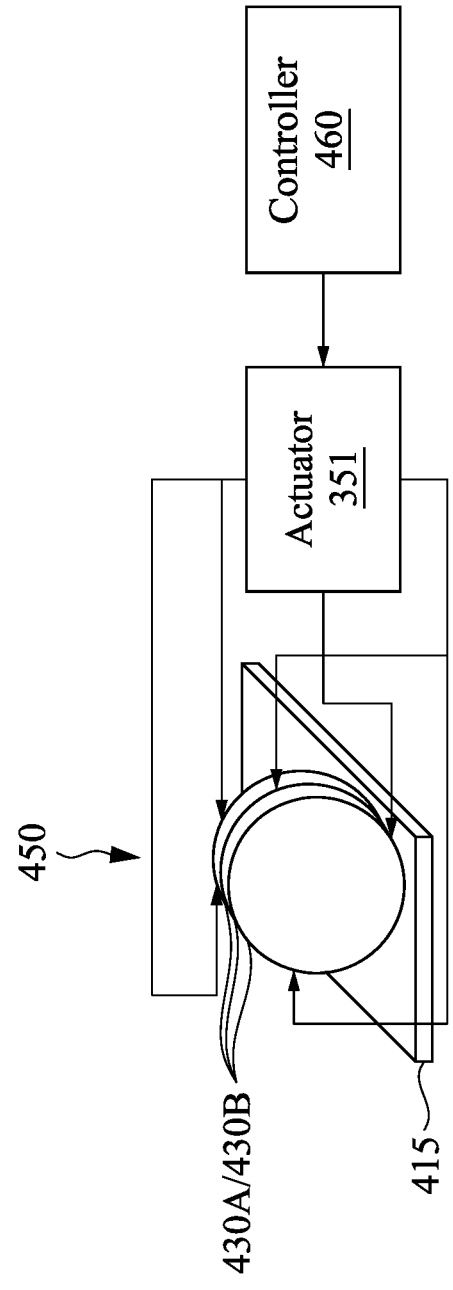

FIGS. 3A, 3B, 3C, 3D, 3E, and 3F show facet mirrors and facet mirror control systems in accordance with some embodiments of the present disclosure. As shown in FIGS. 3A and 3B, the facet mirror 450 (a stacked facet mirror) includes two or more facets (mirrors) 430A or 430B and the facet mirror 450 is part of the field facet module 262 or the pupil facet module 264. In some embodiments, as shown in the facet mirror control system 470 of FIG. 3A, the facets 430A or 430B are coupled to an actuator 351 including, for example, one or more motors or piezo electric devices to move each one of the facets 430A or 430B along the X, Y and/or Z directions by a controller 460. In some embodiments, the Z direction is normal to the surface of the facet (parallel with the optical axis). In some embodiments, the controller 460 coupled to the actuator 351 to control the movement of the facets 430A up and down in the Z-direction (closer to or farther from facets 430B of the pupil facet module 264), laterally in the X-direction, and back and forth in the Y-direction. In some embodiments, the field facet is moved within ± about 20 mm along the Z direction. In some embodiments, a tilt angle of the facet 430A or 430B is also controlled to change a projection of the EUV radiation beam on the pupil facet module or on the reticle 205. In some embodiment, by controlling the tilt angle, the reflected EUV radiation beam from the facet 430A of the field facet module 262 in projected to another facet 430B of the pupil facet module 264. In some embodiments, the controller 460 coupled to the actuator 351 moves the facet mirrors 430B up and down in the Z-direction (closer to or farther from the reticle 205), and/or laterally in the X-direction and/or in the Y-direction. In some embodiments, the controller 460 simultaneously moves a stack of two or more facet mirrors 430A or 430B or individually moves the facet mirrors 430A and 430B in the X-direction, Y-direction, or Z-direction. As shown in FIG. 3B, the controller 460 exerts force through the actuator 351 to at least two locations on a perimeter of each facet 430A or 430B to adjust, e.g., increase or reduce, a curvature of facet mirrors 430A and 430B. As shown in FIG. 3B, the facet mirror 450 is mounted on a support structure 415 in some embodiments.

Figure 3D:
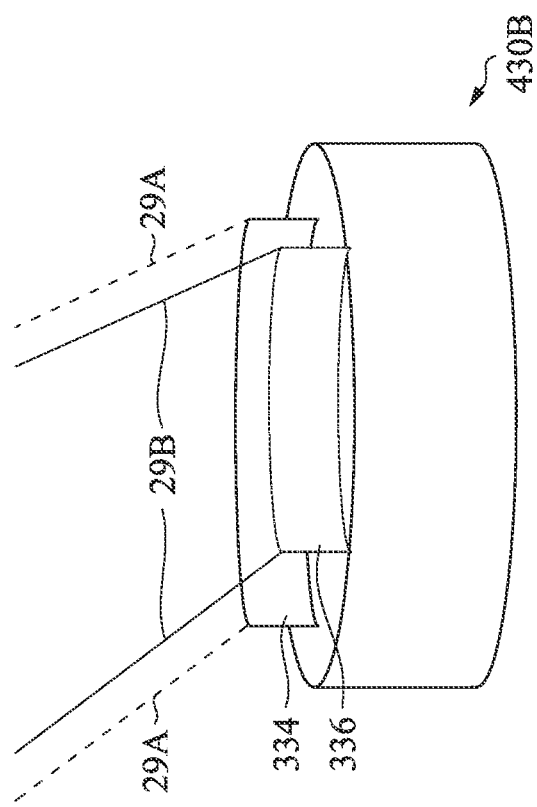
Figure 3C:
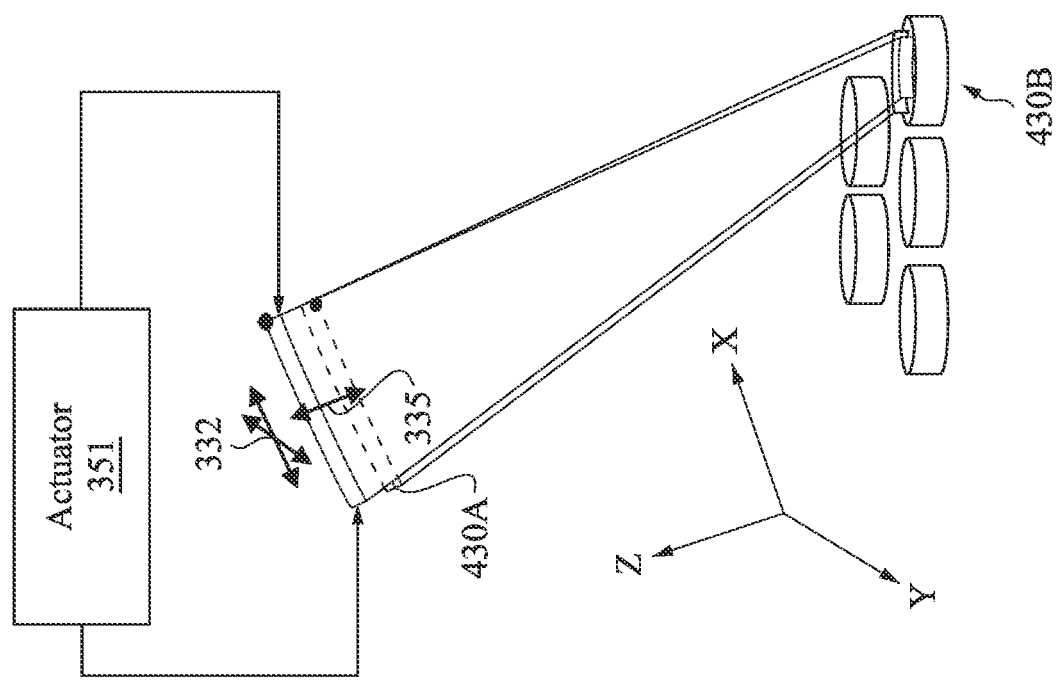

FIG. 3C shows adjusting the location of a facet 430A of the field facet module 262 to adjust the projected beam on a facet 430B of the pupil facet module 264. As shown in FIG. 3C, by moving the facet 430A along the Z direction (the direction of light propagation of the EUV radiation beam 29), it is possible to change (enlarge or shrink) the EUV beam size on the facet 430B of the pupil facet module 264, which in turn changes the EUV beam size projected onto the reticle 205 formed by the reflected lights from the plurality of the facets 430B of the pupil facet module 264. As noted, the facets 430A or 430B are two or more of the same facet mirrors 430A or 430B that are stacked together as shown in FIG. 2B. As shown, the actuator 351 moves one or more of the facets 430A in a direction 335 (Z-direction or the direction of propagation of the EUV radiation beam) or in the lateral direction 332, X-direction and/or Y-direction.

As noted, one or more facets 430B of the pupil facet module 264 may be moved in the direction of light propagation of the EUV radiation beam 29 or in the lateral direction to further adjust the EUV beam size and location on the reticle 205. As shown in FIG. 3D, when the facet 430A moves in the direction 335, the EUV radiation beam 29A becomes the EUV radiation beam 29B and the projected light 334 on the facet 430B shrinks to projected light 336. Additionally, laterally moving the facet 430A in the direction 332, laterally moves the projected light 336 or 334 on the facet 430B.

Figure 3F:
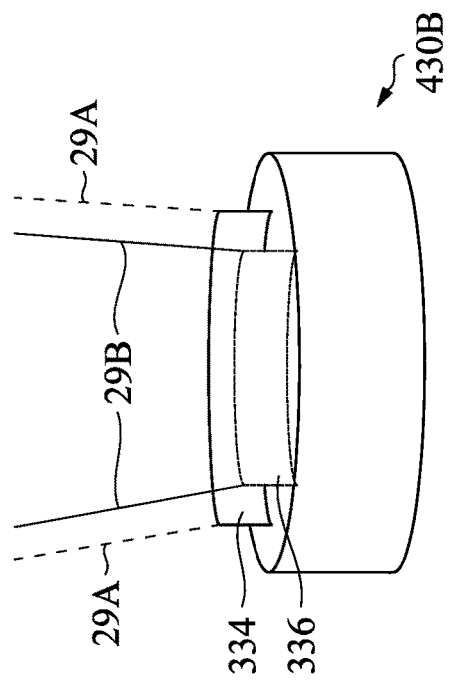
Figure 3E:
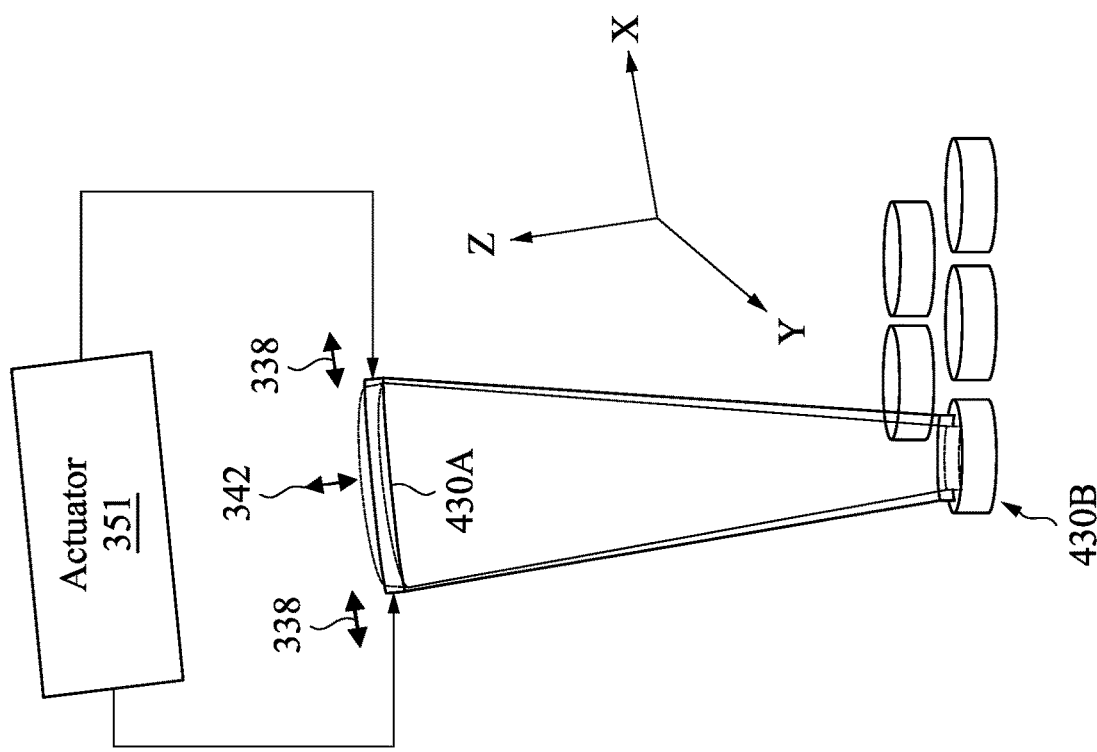

In some embodiments, as shown in FIG. 3E, the actuator 351 is configured to exert pressure along a line 338 to change a curvature of the facet 430A by moving the curvature along a line 342 to change a focal position/distance of the facet 430A, which in turn changes an EUV beam size on the facet 430B of the pupil facet module 264. In some embodiments, the actuator 351 includes a plurality of pistons or piezoelectric elements to change the curvature of the facets. As shown in FIG. 3F, when pressure is exerted to at least two locations on a perimeter of the facet 430A and the curvature moves up along the line 342, the focal distance of the facet 430A is reduced and the EUV radiation beam 29A becomes the EUV radiation beam 29B and the projected light 334 on the facet 430B shrinks to projected light 336. Additionally, the actuator 351 may exert pressure at two or more locations of one or more facets 430B of the pupil facet module 264 to change the curvature of the one or more facets 430B to adjust the EUV beam size on the reticle 205.

In some embodiments, the controller 460 simultaneously exerts pressure to two or more facet 430A or 430B to simultaneously change the curvature of two or more facets or individually exerts pressure to a facet 430A or 430B to change the curvature of one facet. In some embodiments, the curvature is changed within about ±5% from the original curvature (±5% of the focal length from the original focal length).

In some embodiments, the controller 460 is coupled to the actuator 351 to control the movement of the field facet module laterally in the X-direction or Y-direction (parallel to the surface of the facet 430A or 430B) or up and down in the Z-direction, e.g., the direction of the EUV radiation beam transmission (perpendicular to the surface of the facet 430A or 430B). In some embodiments, the facets 430A or 430B are moved together in the Y-direction, in the X-direction, or in the Z-direction.

In some embodiments, each facet mirror includes between about 300 facets and about 1600 facets and has a thickness between about 10 mm and about 30 mm. In some embodiments, a facet mirror includes between about 50 facets and about 2000 facets and has a thickness between about 2 mm and about 40 mm. In some embodiments, a facet mirror is either a flat mirror having flat facets, a convex mirror having convex facets, or a concave mirror having concave facets. In some embodiments, a facet mirror is either a convex mirror having flat facets and convex facets or a concave mirror having flat facets and concave facets.

In some embodiments, as noted, one or more of the facets 430B of the pupil facet module 264 are also controllable to change the beam shape/size at the reticle 205, similar to the facets 430A of the field facet module 262.

Figure 4A:
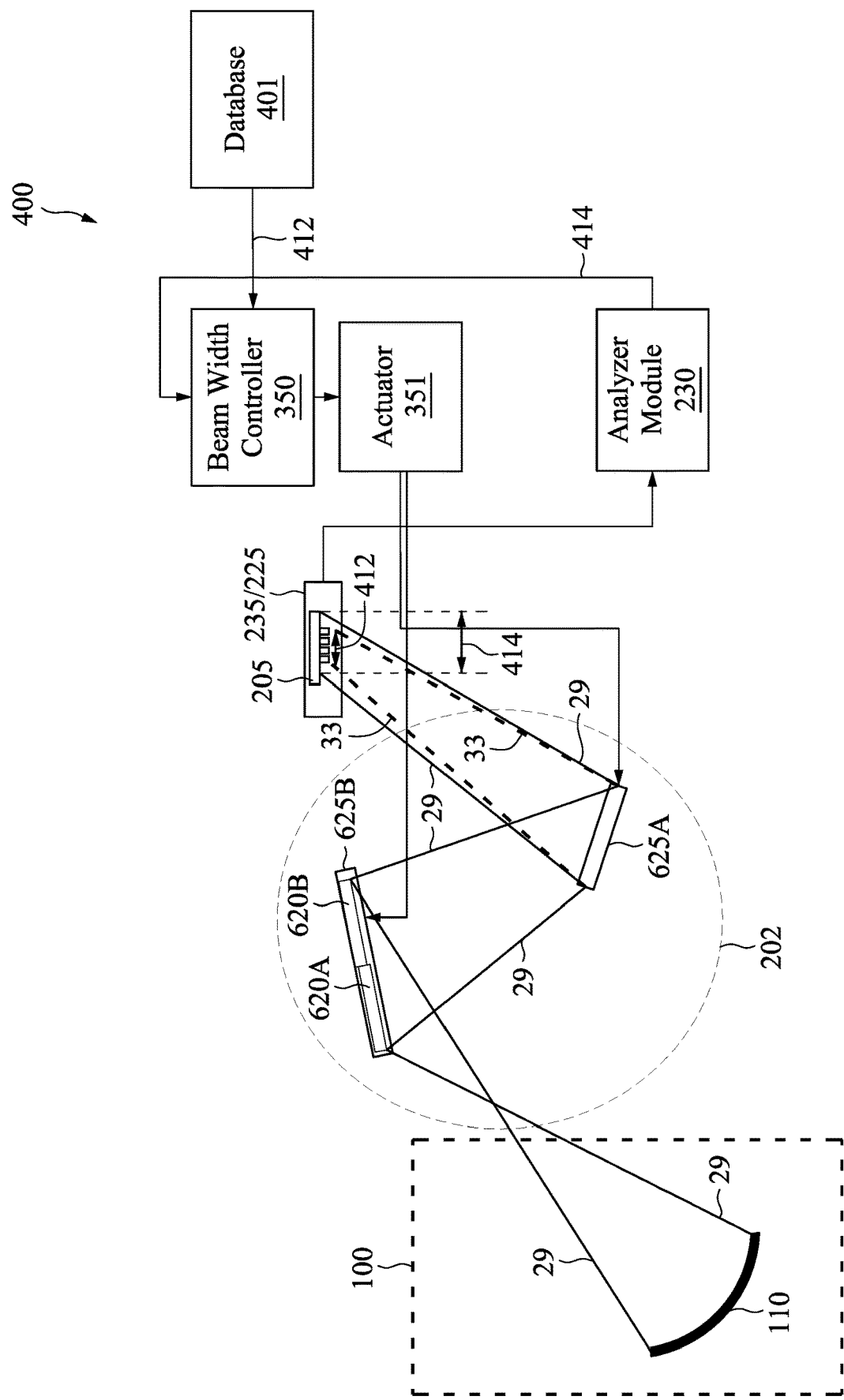
FIGS. 4A, 4B, 4C, and 4D show an EUV lithography system having an EUV radiation source and an exposure device including mirrors of the illumination system of the exposure device and a control system for adjusting an extent of the EUV radiation beam, a multi segment facet mirror, a beam width adjuster system, and a graph of EUV blockage in accordance with some embodiments of the present disclosure.

FIGS. 4A, 4B, 4C, and 4D show an EUV lithography system 400 having an EUV radiation source and an exposure device including facet mirrors 625A and 625B of the illumination system of the exposure device and a control system for adjusting an extent of the EUV radiation beam, a multi segment facet mirror 425, a beam width adjuster system, and a graph of EUV blockage in accordance with some embodiments of the present disclosure. FIG. 4A is consistent with FIGS. 2A and 2B and the light beam, e.g., the EUV radiation beam 29, is generated from the EUV radiation source 100. The EUV radiation beam 29 is directed by the illumination optics 202 to the reticle 205. In some embodiments, the facet mirrors 625A and 625B are respectively consistent with the pupil facet module 264 and the field facet module 262, where facet mirrors are adjusted, e.g., facets of each facet mirror 625A or 625B is moved in position and/or direction. As shown, a beam width controller 350, consistent with the controller 460 of FIGS. 3A and 3B, is coupled through the actuator 351 to the facet mirrors 625A and 625B and controls the facets of the facet mirrors, e.g., controls the location of the facets. As shown, the EUV radiation beam is projected on the reticle 205 via the facet mirror 625A which is consistent with the pupil facet module 264. In some embodiments, instead of the reticle 205, an image detector 235 is placed to measure the projected beam. An image of the projected beam is transferred to the analyzer module 230 and the analyzer module 230 determines the dimensions, e.g., the extent, of the projected image in the X-direction and/or Z-direction to determine if extra area is covered by the projected beam and whether an area beyond the layout patterns is covered. If extra area is covered or if the area of coverage is not enough, the analyzer module 230 sends a command to the beam width controller 350 to adjust the area of coverage by change the position or direction of facets of the facet mirrors 625A and 625B. In some embodiments, the extent of the projected beam on the reticle, detected by the image detector 235, is iteratively adjusted such that if the extent of the projected beam on the reticle is larger/smaller than a width 412 of the layout patterns on the reticle, one or more facets 430B of the pupil facet module 264 and/or one or more facets 430A of the field facet module 262 are moved or the curvatures of the facets are adjusted (increased or decreased) to make the extent of the projected beam on the reticle is sufficiently the same as the width 412 of the layout patterns on the reticle.

Figure 4B:
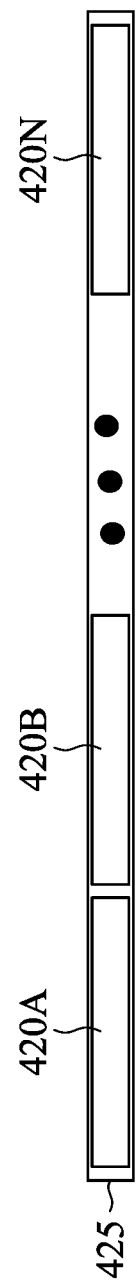

In some embodiments, as shown in FIG. 4A, the coverage width 414 is larger than the width 412 of the layout patterns (e.g., a pattern area size) of the reticle 205 and the beam width controller 350 adjusts the coverage width 414 to become the same as the width 412 of the layout patterns and, thus, no blockage is used. As shown, the width 412 is received from a database 401 that includes pattern area size of the reticles. In some embodiments, the database 401 includes information of the facets 430A and 430B and the structure of the facets of the field facet module 262 and the pupil facet module 264 that is used by the beam width controller 350 to determine an amount and direction of movement of the facets 430A and 430B or determine an amount of curvature change of the facets 430A and 430B. In some embodiments, the EUV light intensity is increased by beam re-shaping by about 5%-30% compared with the case when the EUV light is merely blocked by the REMAs. In some embodiments, in addition to adjusting the coverage width 414 by the beam width controller 350, REMAs are also used for fine tuning the coverage width 414 and, thus, some blockage, to block about 1% to 2% of the EUV light may be used. In some embodiments, as shown in FIG. 4A, the facets of the facet mirror 625A and/or the facets of the facet mirror 625B are moved in the direction of transmission of the EUV radiation beam 29 to adjust coverage width 414 to become the width 412. As shown, by moving the facets, the EUV radiation beam 33 is reflected from the facet mirror 625A and the EUV radiation beam 33 has the width 412 on the reticle 205 and, thus, does not cover outside the layout patterns of the reticle 205. In some embodiments, as shown in FIG. 4A, the facet mirror 625B includes, for example, two separate facet sections 620A and 620B that are independently controlled by the beam width controller 350 through the actuator 351. The facet sections 620A and 620B are coupled to the actuator 351 that is coupled to the beam width controller 350 to move each one of the facets with respect to each other. In some embodiments, the facets are moved independently in the X-direction, in the Y-direction, and in the Z-direction. In some embodiments, two or more facets are moved together in the same direction. In some embodiments, two or more facets are moved together in the Y-direction to adjust the extent of the EUV radiation beam when impinges on the reticle 205. FIG. 4B shows the multi segment facet mirror 425 having three or more separate facet sections 420A, 420B, 420N, etc., that are independently controlled. In some embodiments, the illumination optics 202 or the projection optics 204 includes two or more of the multi segment facet mirrors 425. In some embodiments, each one of the facets of the mirrors 625A and 625B are independently moved to adjust the width of the EUV radiation beam on the reticle 205. In some embodiments, the width of the EUV radiation beam is determined at a predetermined distance from a mirror, e.g., the mirror 625A or the mirror 625B. In some embodiment, the predetermined distance is a distance from one of the mirrors 625A or 625B to the reticle 205. In some embodiments, pressure is exerted by actuator 351 on one or more facets of the mirrors 625A and/or 625B to change the curvature and focal length of the one or more facets to adjust the width of the EUV radiation beam on the reticle 205.

Figure 4C:
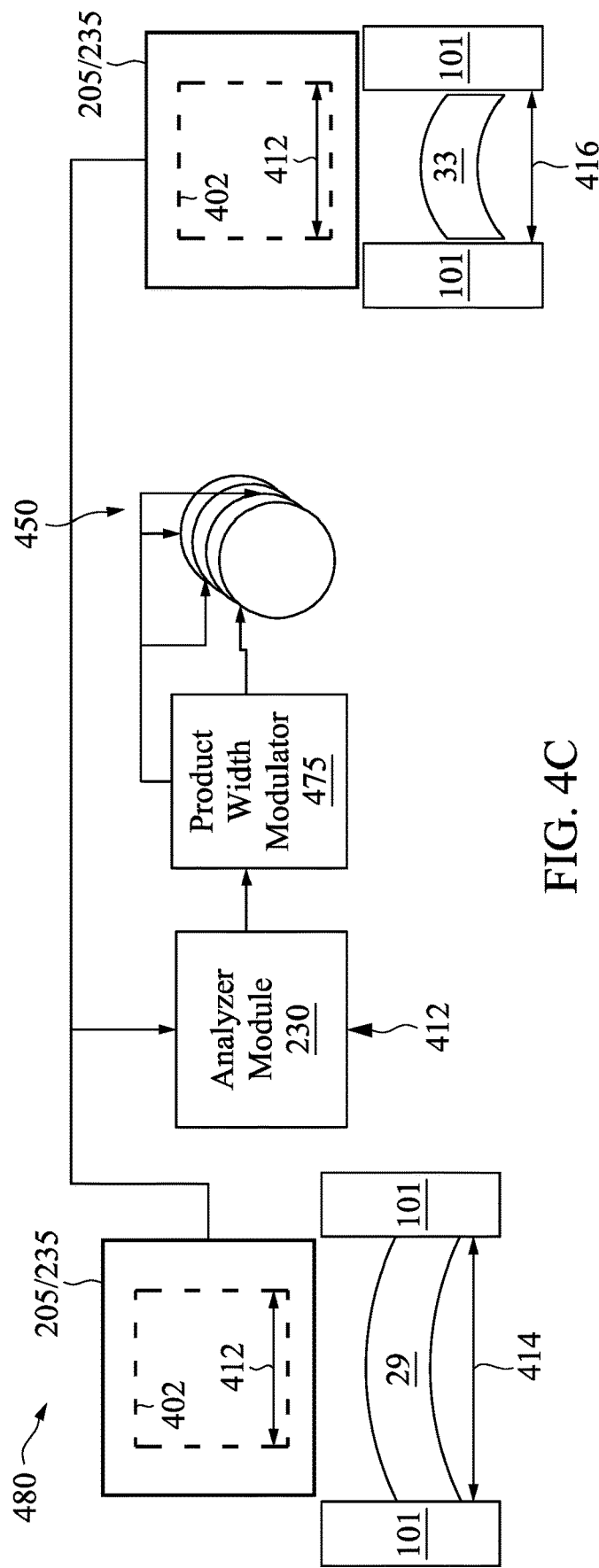

FIG. 4C shows a beam width adjuster system 480 showing the width 414 of the EUV radiation beam 29 before adjustment and a width 416 of the EUV radiation beam 33 after adjustment. An area 402 is the area covered by the layout patterns of the reticle 205. As shown, the width 414 of the EUV radiation beam 29 is larger than the width 412 of the layout pattern and, thus, the REMAs 101 may be moved inward to prevent the extra coverage of the EUV radiation beam 29 and cause valuable EUV radiation loss. The location of REMAs is determined by the size of the layout pattern or is simply provided from outside the EUV tool. As shown in FIG. 4C, in some embodiments, the reticle 205 includes the image detector 235 or is replaced with the image detector 235. The analyzer module 230 receives the width 414 of the EUV radiation beam 29 from the image detector 235 or determines the width 414 of the EUV radiation beam 29 from an image received from the image detector 235 and also receives the information of the layout pattern width 412 on the reticle 205. The analyzer module 230 is coupled to a product width module 475 that is a combination of the beam width controller 350 and the actuator 351 in some embodiments. The product width module 475 controls the facets of the facet mirror 450 and modifies the width of the radiation beam and generates the EUV radiation beam 33 that has a smaller width 416 that is essentially the same as the layout pattern width 412 and, thus, REMAs 101 do not need to be moved to prevent the extra coverage and does not cause valuable EUV radiation loss. In other embodiments, the beam width is adjusted simply based on the layout pattern.

Figure 4D:
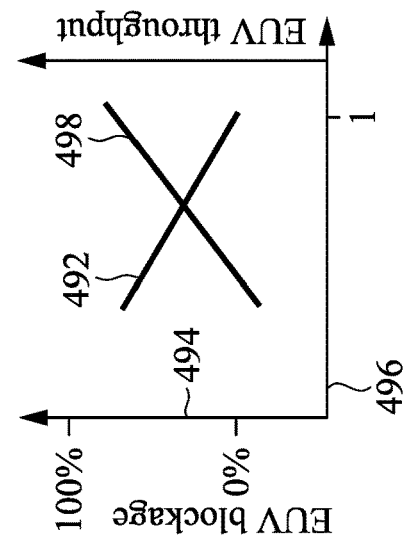

FIG. 4D shows the graph 492 of EUV blockage 494 based on beam width ratio 496 that is a ratio of the width 412 to width 414. As shown, the EUV blockage 494 in reduced and the EUV throughput 498 is increased when the ratio 496 of the width 412 to width 414 is increased.

Figure 5:
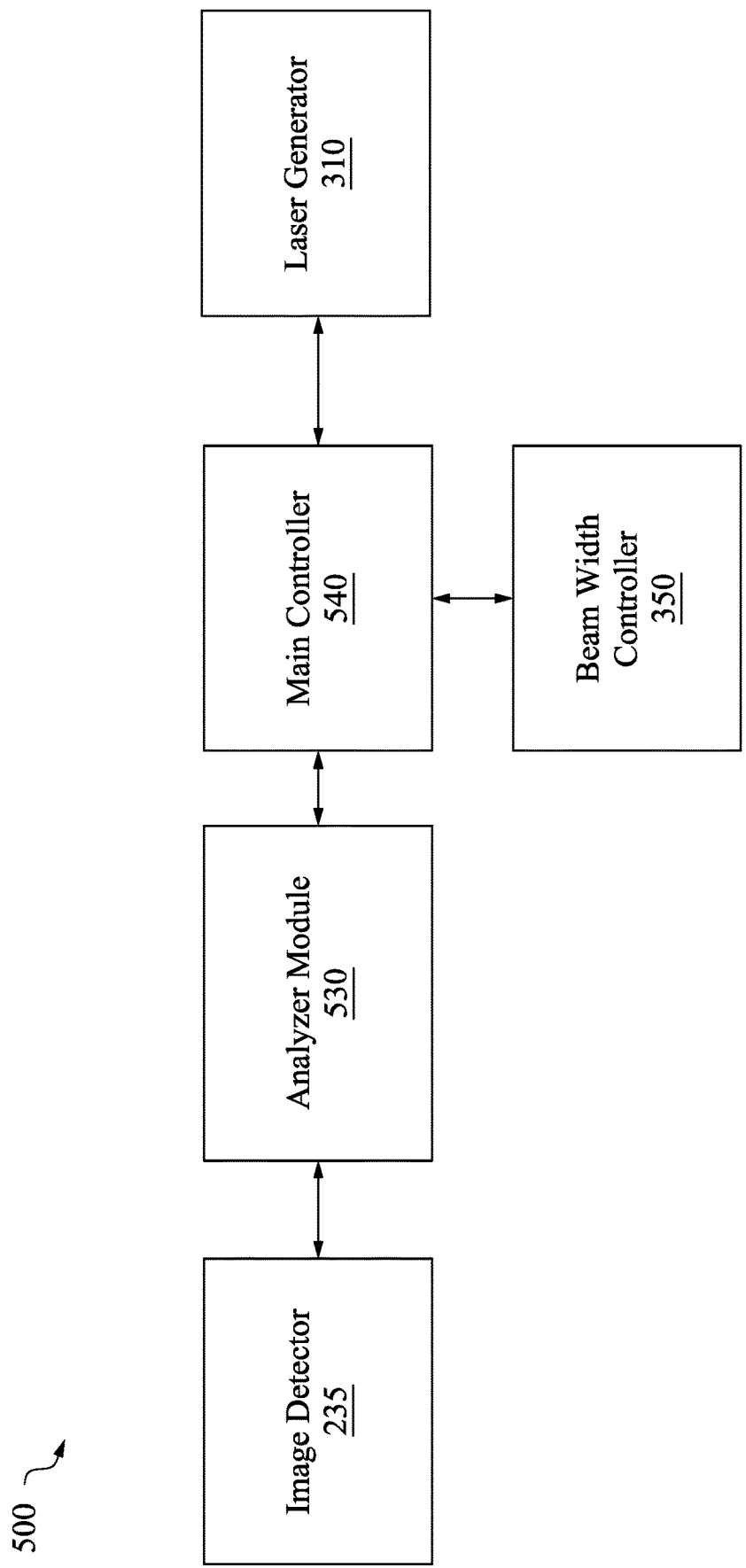
FIG. 5 shows a control system for adjusting the extent of the EUV radiation beam of the lithographic system in accordance with some embodiments of the present disclosure.

FIG. 5 shows a control system 500 for adjusting the extent of the EUV radiation beam of the lithographic system in accordance with some embodiments of the present disclosure. The control system 500 includes an analyzer module 530, which is consistent with the analyzer module 230 of FIGS. 2A and 4A. The control system 500 also includes a main controller 540 coupled to the analyzer module 530. In some embodiments, the control system 500 includes the beam width controller 350 of FIG. 4A and the laser generator 310 of FIG. 1. In some embodiments, the control system 500 includes the image detector 235 of FIGS. 2A and 4A that is coupled to the analyzer module 530.

In some embodiments and referring to FIG. 4A, the main controller 540 commands the analyzer module 530 to receive the captured image to analyze the captured image to determine if extra area is covered by the EUV radiation beam 29. In some embodiments, the main controller 540 commands the laser generator 310 to begin sending the excitation pulse and generating the EUV radiation beam 29 such that the image detector 235 receives the image of the projected EUV radiation beam. In some embodiments, the main controller 540 commands the beam width controller 350 to apply a set of voltages to a actuator 351 (e.g., an electric motor) to move the facets of the facet mirrors to adjust the extent of the EUV radiation beam on the reticle 205.

Figure 6B:
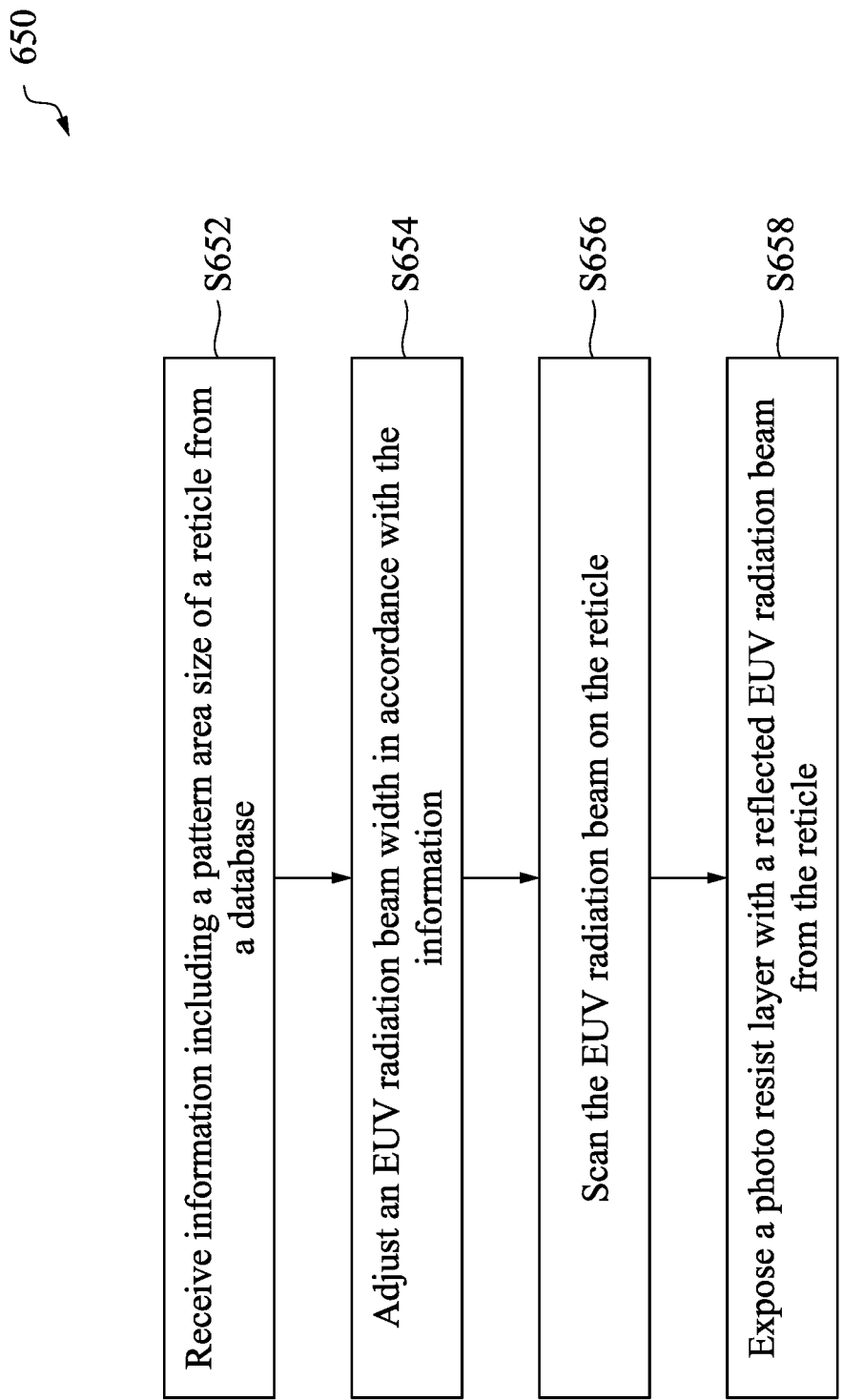
Figure 6C:
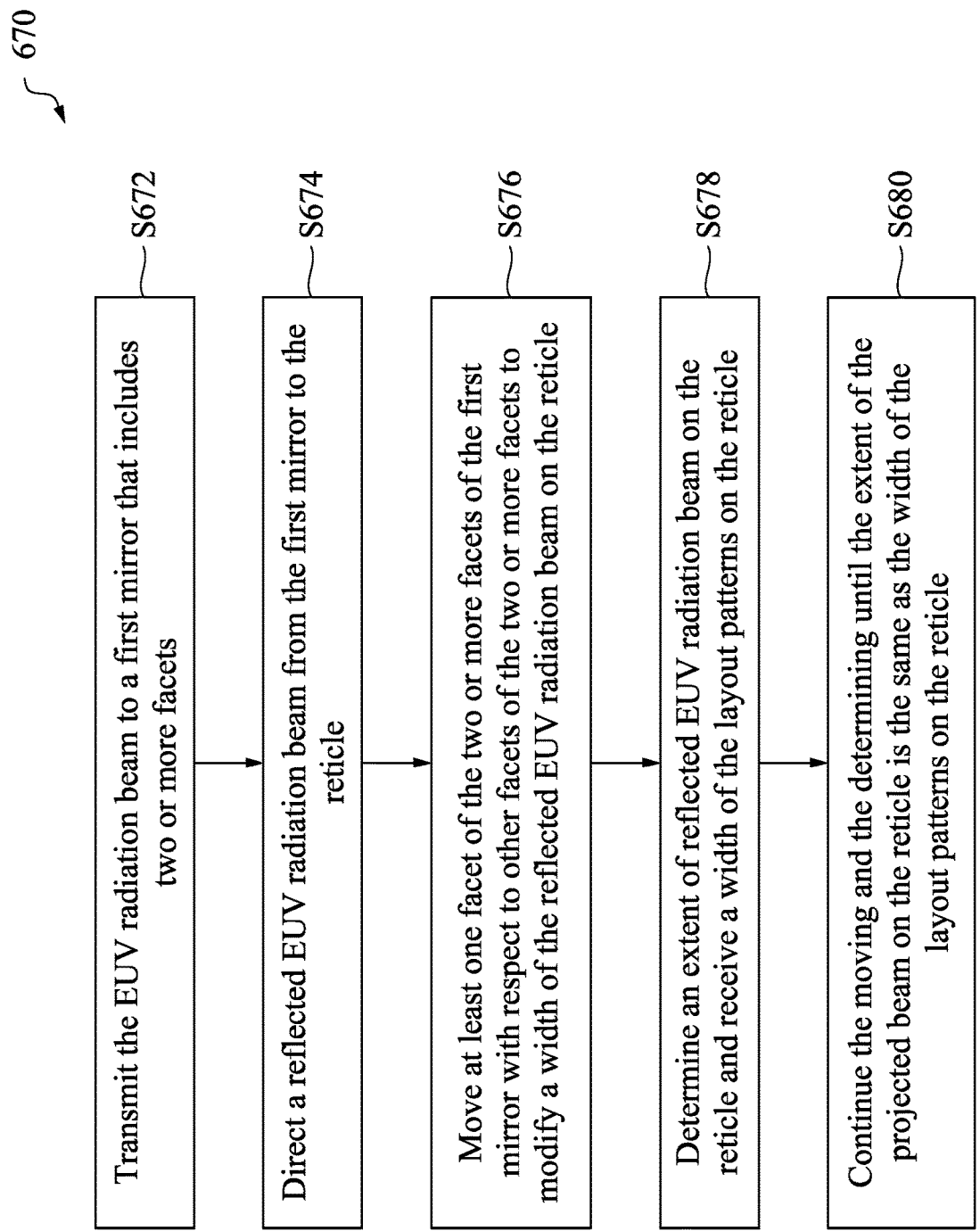

FIGS. 6A, 6B, and 6C show a flow diagrams of processes 600, 650, and 670 for adjusting the extent of the EUV radiation beam of the lithographic system and producing a resist layer in accordance with some embodiments of the present disclosure. The processes 600, 650, and 670 or a portion of the processes 600, 650, and 670 may be performed by the EUV lithography system 400 and the beam width adjuster system 480 of FIGS. 4A and 4C. In some embodiments, the processes 600, 650, and 670 or a portion of the processes 600, 650, and 670 are performed and/or are controlled by the computer system 700 described below with respect to FIGS. 7A and 7B. In some embodiments, the processes 600, 650, and 670 or a portion of the processes 600, 650, and 670 are performed by the control system 500 of FIG. 5 described above.

The process 600 includes an operation S602, where an incident first EUV radiation beam is transmitted to a mirror that comprises two or more facets. As shown in FIG. 4A, the EUV radiation beam 29 is transmitted to the mirror 625A that comprises a plurality of facets. In operation S604, a second EUV radiation beam reflected from the mirror is directed to a reticle. As shown in FIG. 4A, the EUV radiation beam 29 that is reflected from the mirror 625A is directed to the reticle 205. In operation S606, at least one facet of the two or more facets of the mirror is moved with respect to other facets of the two or more facets to adjust a width of the second EUV radiation beam on the reticle. As shown in FIGS. 3C, 3D, and 4A, at least one facet 430B is moved with respect to the other facets 430B to adjust the width 414 of the EUV radiation beam 29. As shown, the beam width controller 350 moves the at least one facet 430B of the two or more facets 430B of the mirror 625A to produce the reflected EUV radiation beam 33 having the width 412. In some embodiments, one or more voltages are applied by the beam width controller 350 to the actuator 351 to move the at least one facet of the two or more facets of the mirror to modify, e.g., reduce or increase, the dimension of the reflected beam of EUV radiation in X-direction or Z-direction. In some embodiments, the two or more voltages are applied to move two or more facets in the Y-direction, e.g., the direction of the EUV radiation transmission, to adjust the lateral width of the reflected beam of EUV radiation in the X-direction and/or in the Z-direction. In some embodiments, the two or more voltages are applied to move the two or more facets together in the Y-direction to adjust the lateral width of the reflected beam of EUV radiation in the X-direction and/or in the Z-direction.

The process 650 includes an operation S652, where information including a pattern area size of a photo mask is received from a database. As shown in FIG. 4C, the width 412 of the layout patterns on the reticle 205 is received by the analyzer module 230. In addition, the analyzer module 230 determines the width 414 of the EUV radiation beam 29. In operation S654, the EUV radiation beam width is adjusted in accordance with the information. As shown in FIGS. 4A and 4C, the beam width is adjusted by the beam width controller 350 or the product width modulator 475 through moving the facets of the facet mirror 450. In operation S656, the EUV radiation beam scans the reticle 205, e.g., the photo mask. As shown in FIGS. 4A and 4C, the reduced beam width of the EUV radiation beam 33 scans reticle 205. In operation S658, a photo resist layer is exposed with a reflected EUV radiation beam from the reticle. As shown in FIGS. 2A and 8C, the photo resist (PR) layer over the target layer (TL) is exposed to the reflected EUV radiation beam from the reticle 205. In some embodiments, the adjustment modifies, e.g., increases, an average intensity per unit area of the EUV radiation beam on the reticle. In some embodiments, the adjustment causes a variation, based on the width, of the average intensity per unit area of the EUV radiation beam on the reticle. In some embodiments, an increase of intensity per unit area of the EUV radiation beam on the reticle after the adjusting the width is greater when the width before adjustment is W1 compared to an increase of intensity per unit area of the EUV radiation beam on the reticle after the adjusting the width when the width before adjustment is W2 when W1>W2. The process 670 includes an operation S672, where the EUV radiation beam is transmitted to a first mirror that includes two or more facets. As shown in FIG. 4A, the EUV radiation beam 29 is transmitted to the mirror 625A that comprises a plurality of facets. In operation S674, a reflected EUV radiation beam is directed from the first mirror to the reticle. As shown in FIG. 4A, the EUV radiation beam 29 that is reflected from the mirror 625A is directed to the reticle 205. In operation S676, at least one facet of the two or more facets of the first mirror is moved with respect to other facets of the two or more facets to modify a width of the reflected EUV radiation beam on the reticle. As shown in FIGS. 3A, 3B, and 4A a facet is moved by the actuator 351. In operation S678, an extent of reflected EUV radiation beam on the reticle is determined and a width of the layout patterns on the reticle is received. As shown in FIG. 4A, a width 412 of the layout patterns on the reticle 205 is received from the database 401 and the beam width controller 350 receives from the image detector 235 the image of the projected EUV radiation beam to determine the width of the layout patterns on the reticle. In operation S680, the moving and the determining continues until the extent of the projected beam, the width 414 of the EUV radiation beam, on the reticle is the same as the width 412 of the layout patterns on the reticle. As shown, the iterative procedure continues in FIG. 4A.

Figure 7B:
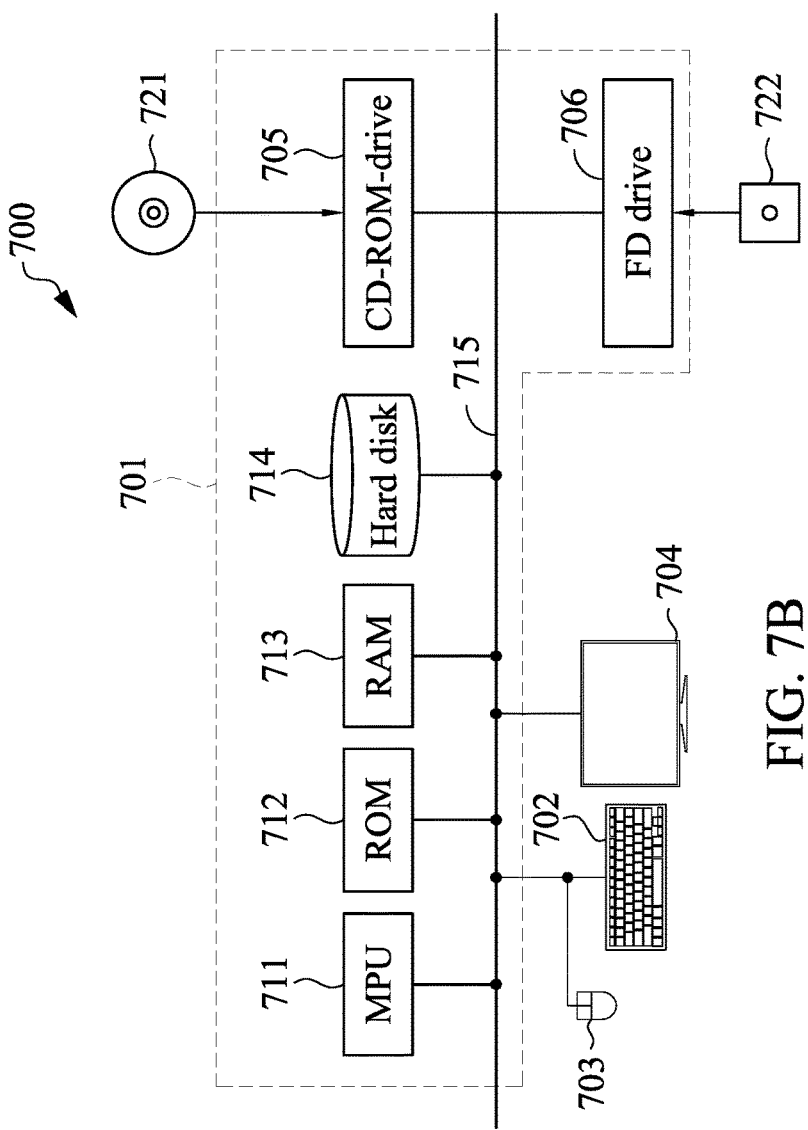
FIGS. 7A and 7B illustrate an apparatus for adjusting the extent of the EUV radiation beam of the lithographic system in accordance with some embodiments of the present disclosure.
Figure 7A:
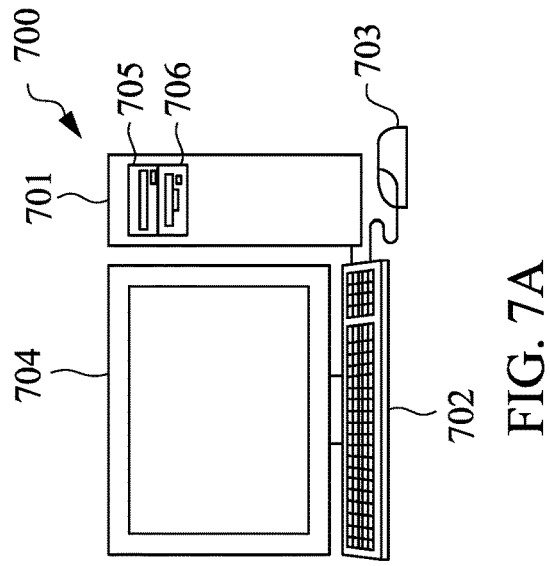

FIGS. 7A and 7B illustrate an apparatus for adjusting the extent of the EUV radiation beam of the lithographic system in accordance with some embodiments of the present disclosure. In some embodiments, the computer system 700 is used for performing the functions of the modules of FIG. 5 that include the main controller 540, the analyzer module 530, and the beam width controller 350. In some embodiments, the computer system 700 is used to execute the process 600 or a portion of the process 600 of FIG. 6A.

FIG. 7A is a schematic view of a computer system that performs the functions of an apparatus for adjusting the extent of the EUV radiation beam of the lithographic system. All of or a part of the processes, method and/or operations of the foregoing embodiments can be realized using computer hardware and computer programs executed thereon. In FIG. 7A, a computer system 700 is provided with a computer 701 including an optical disk read only memory (e.g., CD-ROM or DVD-ROM) drive 705 and a magnetic disk drive 706, a keyboard 702, a mouse 703, and a monitor 704.

FIG. 7B is a diagram showing an internal configuration of the computer system 700. In FIG. 7B, the computer 701 is provided with, in addition to the optical disk drive 705 and the magnetic disk drive 706, one or more processors, such as a micro processing unit (MPU) 711, a ROM 712 in which a program such as a boot up program is stored, a random access memory (RAM) 713 that is connected to the MPU 711 and in which a command of an application program is temporarily stored and a temporary storage area is provided, a hard disk 714 in which an application program, a system program, and data are stored, and a bus 715 that connects the MPU 711, the ROM 712, and the like. Note that the computer 701 may include a network card (not shown) for providing connection to a LAN.

The program for causing the computer system 700 to execute the functions for adjusting the extent of the EUV radiation beam of the lithographic system in the foregoing embodiments may be stored in an optical disk 721 or a magnetic disk 722, which are inserted into the optical disk drive 705 or the magnetic disk drive 706, and transmitted to the hard disk 714. Alternatively, the program may be transmitted via a network (not shown) to the computer 701 and stored in the hard disk 714. At the time of execution, the program is loaded into the RAM 713. The program may be loaded from the optical disk 721 or the magnetic disk 722, or directly from a network. The program does not necessarily have to include, for example, an operating system (OS) or a third party program to cause the computer 701 to execute the functions of the control system for reducing the extra coverage of the EUV radiation beam of the lithographic system in the foregoing embodiments. The program may only include a command portion to call an appropriate function (module) in a controlled mode and obtain desired results.

Figure 8A:
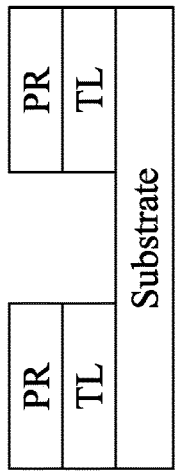
FIGS. 8A, 8B, 8C, and 8D show a sequential manufacturing operation of a method of making a semiconductor device in accordance with embodiments of present disclosure.
Figure 8C:
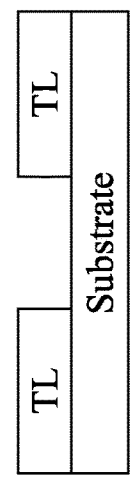
Figure 8B:
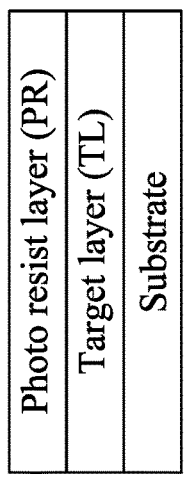

FIGS. 8A, 8B, 8C, and 8D show a sequential manufacturing operation of a method of making a semiconductor device in accordance with embodiments of present disclosure. As shown in FIG. 8A, a photo resist layer PR is formed over a target layer TL that is disposed on a substrate. The photo resist layer PR is sensitive to the radiation from the exposing source during a subsequent photolithography exposing process. In the present embodiment, the photo resist layer is sensitive to EUV light used in the photolithography exposing process. The photo resist layer PR may be formed over the target layer TL by spin-on coating or other suitable techniques. The coated photo resist layer may be further baked to drive out solvent in the photo resist layer. As shown in FIG. 8B, the photoresist layer PR is patterned using an EUV reflective mask as set forth above. The patterning of the photoresist layer includes performing a photolithography exposing process by an EUV exposing system using the EUV mask, e.g., the reticle 205. During the exposing process, the integrated circuit (IC) design pattern defined on the EUV mask is imaged to the photoresist layer to form a latent pattern thereon as shown in FIG. 2A. The patterning of the photoresist layer further includes developing the exposed photoresist layer PR to form a patterned photoresist layer having one or more openings. In one embodiment where the photoresist layer is a positive tone photoresist layer, the exposed portions of the photoresist layer are removed during the developing process. The patterning of the photoresist layer may further include other process steps, such as various baking steps at different stages. For example, a post-exposure-baking (PEB) process may be implemented after the photolithography exposing process and before the developing process.

Figure 8D:
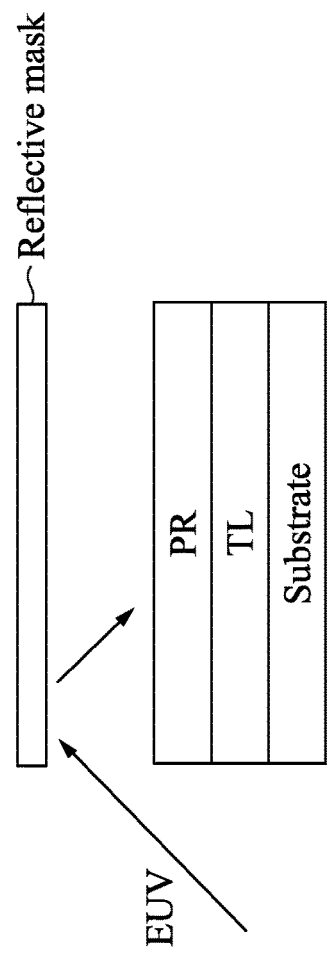

As shown in FIG. 8C, the target layer TL is patterned utilizing the patterned photoresist layer as an etching mask. In some embodiments, the patterning the target layer includes applying an etching process to the target layer using the patterned photoresist layer as an etch mask. The portions of the target layer exposed within the openings of the patterned photoresist layer are etched while the remaining portions are protected from etching. Further, the patterned photoresist layer may be removed by wet stripping or plasma ashing, as shown in FIG. 8D.

According to some embodiments of the present disclosure, a pattern formation method includes receiving information including a pattern area size of a reticle from a database and adjusting a width of an EUV radiation beam in accordance with the information. The method also includes scanning the EUV radiation beam on the reticle and exposing a photo resist layer with a reflected EUV radiation beam from the reticle such that an increase of intensity per unit area of the EUV radiation beam on the reticle after the adjusting the width is greater when the width before adjustment is W1 compared to an increase of intensity per unit area of the EUV radiation beam on the reticle after the adjusting the width when the width before adjustment is W2 when W1>W2. In an embodiment, the adjusting the width of the EUV radiation beam includes transmitting the EUV radiation beam to a first mirror that comprises two or more facets, directing a reflected EUV radiation beam from the first mirror to the reticle; and moving at least one facet of the two or more facets of the first mirror with respect to other facets of the two or more facets to modify a width of the reflected EUV radiation beam on the reticle; determining an extent of reflected EUV radiation beam on the reticle; receiving a width of the layout patterns on the reticle; and continue the moving and the determining until the extent of the projected beam on the reticle is the same as the width of the layout patterns on the reticle. In an embodiment, the at least one facet is moved in a direction of EUV radiation beam transmission to adjust the width of the reflected EUV radiation beam on the reticle. In an embodiment, the at least one facet is moved in a lateral direction relative to the direction of EUV radiation beam transmission to laterally move reflected EUV radiation beam from the first mirror on the reticle. In an embodiment, the incident first EUV radiation beam is originated from an EUV radiation source and the incident first EUV radiation beam is reflected from a second mirror. In an embodiment, the second mirror comprises two or more second facets and the method further includes adjusting a curvature of at least one second facet of the two or more second facets of the second mirror to adjust the width of the second EUV radiation beam on the reticle.

According to some embodiments of the present disclosure, a method of adjusting a beam width of an EUV radiation beam includes receiving a first EUV radiation beam from an EUV radiation source and transmitting the first EUV radiation beam to a first mirror that comprises two or more first facets. The method also includes directing a second EUV radiation beam reflected from the first mirror to a second mirror that comprises two or more second facets and directing a third EUV radiation beam relected from the second mirror to a reticle. The method further includes moving at least one first facet of the two or more first facets of the first mirror with respect to other first facets of the two or more first facets and moving at least one second facet of the two or more second facets of the second mirror with respect to other second facets of the two or more second facets to adjust a width of the third EUV radiation beam on the reticle. In an embodiment, the two or more first facets of the first mirror are disposed side by side in two separate sections such that each section includes one or more first facets. In an embodiment, the two separate facet sections of the first mirror includes a first facet section and a second facet section, and the moving the at least one first facet of the two or more first facets includes moving at least one first facet of the first facet section or the second facet section. In an embodiment, the method further includes independently moving each one of the first facets of the first mirror and moving each one of the second facets of the second mirror to adjust the width of the third EUV radiation beam on the reticle. In an embodiment, the method further includes moving the first facets and the second facets by an actuator coupled and controlled by a beam width controller. In an embodiment, the method further includes sending one or more first voltages by the beam width controller to the actuator to move the first facets and sending one or more second voltages by the beam width controller to the actuator to move the second facets. In an embodiment, the method further includes independently moving one or more first facets along a direction of EUV radiation beam transmission to reduce the width of the third EUV radiation beam on the reticle and independently moving one or more second facets along the direction of EUV radiation beam transmission to reduce the width of the third EUV radiation beam on the reticle.

According to some embodiments of the present disclosure, a mirror system includes a support structure, two or more facets attached to the support structure, and a actuator attached to the one or more facets to move the one or more facets in a direction perpendicular to a surface of facets to modify a width of a reflected extreme ultraviolet (EUV) radiation beam from the two or more facets at a predetermined distance from the mirror system. In an embodiment, the mirror system includes a reticle such that the reflected EUV radiation beam is direction by the two or more facets to the reticle and the movement of the one or more facets reduces the width of the reflected EUV radiation beam on the reticle. In an embodiment, the mirror system includes a beam width controller coupled to via an actuator to the one or more facets to control the movement of the one or more facets. In an embodiment, the movement of the one or more facets includes a positional move in one or more of up, down, right, left, front, and back. In an embodiment, the two or more facets are between 200 facets and 2000 facets. In an embodiment, the mirror system includes an image detector and the reflected EUV radiation beam is direction by the two or more facets to the image detector and the image detector is measures the reflected EUV radiation beam on the image detector. In an embodiment, the mirror system includes an analyzer module coupled between the image detector and the beam width controller. The analyzer module determines a width of the EUV radiation beam on the image detector and the analyzer module commands the beam width controller to adjust the width of EUV radiation beam if the width of EUV radiation beam extends beyond layout patterns of a reticle.

As described, facets of a mirror is moved to modify the beam width of an EUV radiation beam on a reticle to limit the beam width to the extent of the layout patterns of the reticle and avoid using reticle-masks to limit the extra coverage of the EUV radiation beam on a reticle. Thus, increase the throughput and efficiency of the exposure system.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pattern formation method, comprising:
   receiving information including a pattern area size of a reticle from a database;
   adjusting a width of an EUV radiation beam in accordance with the received pattern area size of the reticle of the information to adjust a size of the EUV radiation beam on the reticle to be the same as the pattern area size of the reticle;
   scanning the EUV radiation beam on the reticle; and
   exposing a photo resist layer with a reflected EUV radiation beam from the reticle, wherein an increase of intensity per unit area of the reflected EUV radiation beam on the reticle after the adjusting the width is greater when the width before adjustment is W1 compared to an increase of intensity per unit area of the reflected EUV radiation beam on the reticle after the adjusting the width when the width before adjustment is W2 and W1>W2.

2. The pattern formation method of claim 1, wherein the adjusting the width of the EUV radiation beam comprises:
   transmitting the EUV radiation beam to a first mirror that comprises two or more facets;
   directing a reflected EUV radiation beam from the first mirror to the reticle;
   moving at least one facet of the two or more facets of the first mirror with respect to other facets of the two or more facets to modify a width of the reflected EUV radiation beam on the reticle;
   determining an extent of reflected EUV radiation beam on the reticle;
   receiving a width of layout patterns on the reticle; and
   continuing the moving and the determining until the width of the reflected EUV radiation beam on the reticle is the same as the width of the layout patterns on the reticle.

3. The method of claim 2, wherein the at least one facet is moved in a direction of EUV radiation beam transmission to adjust the width of the reflected EUV radiation beam from the first mirror on the reticle.

4. The method of claim 3, wherein the at least one facet is moved in a lateral direction relative to the direction of EUV radiation beam transmission to laterally move the reflected EUV radiation beam from the first mirror on the reticle.

5. The method of claim 4, wherein the EUV radiation beam is originated from an EUV radiation source, and wherein the EUV radiation beam is reflected from a second mirror before impinging on the first mirror.

6. The method of claim 5, wherein the second mirror comprises two or more second facets, the method further comprising:
   adjusting a curvature of at least one second facet of the two or more second facets of the second mirror to adjust the width of the reflected EUV radiation beam from the first mirror on the reticle.

7. A method of adjusting a beam width of an extreme ultraviolet (EUV) radiation beam, comprising:
   receiving a pattern area size of a reticle from a database;
   receiving a first EUV radiation beam from an EUV radiation source;
   transmitting the first EUV radiation beam to a first mirror that comprises two or more first facets;
   directing a second EUV radiation beam reflected from the first mirror to a second mirror that comprises two or more second facets;
   directing a third EUV radiation beam reflected from the second mirror to the reticle; and
   moving at least one first facet of the two or more first facets of the first mirror with respect to other first facets of the two or more first facets and moving at least one second facet of the two or more second facets of the second mirror with respect to other second facets of the two or more second facets to adjust a width of the third EUV radiation beam on the reticle based on the received pattern area size of the reticle.

8. The method of claim 7, wherein the two or more first facets of the first mirror are disposed side by side in two separate facet sections, wherein each facet section comprises one or more first facets.

9. The method of claim 8, wherein the two separate facet sections of the first mirror comprises a first facet section and a second facet section, and wherein the moving the at least one first facet of the two or more first facets comprises moving at least one first facet of the first facet section or the second facet section.

10. The method of claim 7, further comprising:
    independently moving each one of the first facets of the first mirror and moving each one of the second facets of the second mirror to adjust the width of the third EUV radiation beam on the reticle.

11. The method of claim 10, further comprising:
    moving the first facets and the second facets by an actuator coupled and controlled by a beam width controller.

12. The method of claim 11, further comprising:
    sending one or more first voltages by the beam width controller to the actuator to move the first facets; and
    sending one or more second voltages by the beam width controller to the actuator to move the second facets.

13. The method of claim 11, further comprising:
independently moving one or more first facets along a direction of EUV radiation beam transmission to reduce the width of the third EUV radiation beam on the reticle; and
independently moving one or more second facets along the direction of EUV radiation beam transmission to reduce the width of the third EUV radiation beam on the reticle.

14. A mirror system, comprising:
a support structure;
two or more facets attached to the support structure;
a reticle comprising a pattern area having a pattern area size; and
an actuator attached to the two or more facets and configured to move one or more facets with respect to other one or more facets of the two or more first facets to modify a width of a reflected extreme ultraviolet (EUV) radiation beam reflected from the two or more facets to the reticle based on the pattern area size to adjust a size of the reflected EUV radiation beam on the reticle to be the same as the pattern area size.

15. The mirror system of claim 14,
wherein the movement of the one or more facets is configured to reduce the width of the reflected EUV radiation beam on the reticle.

16. The mirror system of claim 15, further comprising:
a beam width controller coupled to the actuator and configured to control the movement of the one or more facets via the actuator.

17. The mirror system of claim 16, further comprising:
an image detector, wherein the reflected EUV radiation beam is direction by the two or more facets to the image detector, and wherein the image detector is configured to measure the reflected EUV radiation beam on the image detector.

18. The mirror system of claim 17, further comprising:
an analyzer module coupled between the image detector and the beam width controller, wherein the analyzer module is configured to determine the width of the EUV radiation beam on the image detector, and wherein the analyzer module is configured to command the beam width controller to adjust the width of EUV radiation beam if the width of EUV radiation beam extends beyond layout patterns of the reticle.

19. The mirror system of claim 14, wherein the movement of the one or more facets comprises a positional move in one or more of up, down, right, left, front, and back.

20. The mirror system of claim 14, wherein the two or more facets are between 200 facets and 2000 facets.

* * * * *